US012191267B2

(12) United States Patent
Haba et al.

(10) Patent No.: US 12,191,267 B2
(45) Date of Patent: Jan. 7, 2025

(54) NANOWIRE BONDING INTERCONNECT FOR FINE-PITCH MICROELECTRONICS

(71) Applicant: ADEIA SEMICONDUCTOR TECHNOLOGIES LLC, San Jose, CA (US)

(72) Inventors: Belgacem Haba, Saratoga, CA (US); Ilyas Mohammed, Santa Clara, CA (US)

(73) Assignee: Adeia Semiconductor Technologies, LLC, San Jose, CA (US)

(*) Notice: Subject to any disclaimer, the term of this patent is extended or adjusted under 35 U.S.C. 154(b) by 0 days.

(21) Appl. No.: 17/811,713

(22) Filed: Jul. 11, 2022

(65) Prior Publication Data
US 2023/0105341 A1  Apr. 6, 2023

Related U.S. Application Data

(62) Division of application No. 16/776,182, filed on Jan. 29, 2020, now Pat. No. 11,387,202.
(Continued)

(51) Int. Cl.
H01L 23/00 (2006.01)
(52) U.S. Cl.
CPC ............. H01L 24/05 (2013.01); H01L 24/03 (2013.01); H01L 24/08 (2013.01); H01L 24/29 (2013.01);
(Continued)
(58) Field of Classification Search
CPC ....... H01L 2221/1094; H01L 21/02603; H01L 21/02203; H01L 21/31695
See application file for complete search history.

(56) References Cited

U.S. PATENT DOCUMENTS 5,753,536 A  5/1998  Sugiyama et al.
5,771,555 A  6/1998  Eda et al.
(Continued)

FOREIGN PATENT DOCUMENTS

JP  2013-033786 A  2/2013
JP  2018-160519     10/2018
(Continued)

OTHER PUBLICATIONS

G. G. Zhang, and C. C. Wong, "Review of Direct Metal Bonding for Microelectronic Interconnections", Advanced Materials for Micro— and Nano-Systems (AMMNS), DSpace@MIT, Date Published Jan. 2004, Downloaded on May 15, 2024. (Year: 2004).*
(Continued)

Primary Examiner — Amar Movva
(74) Attorney, Agent, or Firm — Knobbe, Martens, Olson & Bear, LLP

(57) ABSTRACT

A nanowire bonding interconnect for fine-pitch microelectronics is provided. Vertical nanowires created on conductive pads provide a debris-tolerant bonding layer for making direct metal bonds between opposing pads or vias. Nanowires may be grown from a nanoporous medium with a height between 200-1000 nanometers and a height-to-diameter aspect ratio that enables the nanowires to partially collapse against the opposing conductive pads, creating contact pressure for nanowires to direct-bond to opposing pads. Nanowires may have diameters less than 200 nanometers and spacing less than 1 μm from each other to enable contact or direct-bonding between pads and vias with diameters under 5 μm at very fine pitch. The nanowire bonding interconnects may be used with or without tinning, solders, or adhesives. A nanowire forming technique creates a nanoporous layer on conductive pads, creates nanowires within pores of the nanoporous layer, and removes at least part of the nanop-
(Continued)

orous layer to reveal a layer of nanowires less than 1 μm in height for direct bonding.

20 Claims, 18 Drawing Sheets

Related U.S. Application Data

(60) Provisional application No. 62/812,778, filed on Mar. 1, 2019.

(52) U.S. Cl.
CPC .............. *H01L 24/80* (2013.01); *H01L 24/83* (2013.01); *H01L 2221/1094* (2013.01); *H01L 2224/0311* (2013.01); *H01L 2224/05624* (2013.01); *H01L 2224/05639* (2013.01); *H01L 2224/05647* (2013.01); *H01L 2224/05655* (2013.01); *H01L 2224/05684* (2013.01); *H01L 2224/0807* (2013.01); *H01L 2224/08503* (2013.01); *H01L 2224/29027* (2013.01); *H01L 2224/29028* (2013.01); *H01L 2224/80815* (2013.01); *H01L 2224/83895* (2013.01)

(56) References Cited

U.S. PATENT DOCUMENTS

| | | |
|---|---|---|
| 6,080,640 A | 6/2000 | Gardner et al. |
| 6,340,822 B1 | 1/2002 | Brown et al. |
| 6,423,640 B1 | 7/2002 | Lee et al. |
| 6,465,892 B1 | 10/2002 | Suga |
| 6,887,769 B2 | 5/2005 | Kellar et al. |
| 6,908,027 B2 | 6/2005 | Tolchinsky et al. |
| 7,045,453 B2 | 5/2006 | Canaperi et al. |
| 7,105,980 B2 | 9/2006 | Abbott et al. |
| 7,193,423 B1 | 3/2007 | Dalton et al. |
| 7,750,488 B2 | 7/2010 | Patti et al. |
| 7,803,693 B2 | 9/2010 | Trezza |
| 8,183,127 B2 | 5/2012 | Patti et al. |
| 8,349,635 B1 | 1/2013 | Gan et al. |
| 8,377,798 B2 | 2/2013 | Peng et al. |
| 8,399,982 B2 | 3/2013 | Wyland |
| 8,441,131 B2 | 5/2013 | Ryan |
| 8,476,165 B2 | 7/2013 | Trickett et al. |
| 8,482,132 B2 | 7/2013 | Yang et al. |
| 8,501,537 B2 | 8/2013 | Sadaka et al. |
| 8,524,533 B2 | 9/2013 | Tong et al. |
| 8,620,164 B2 | 12/2013 | Heck et al. |
| 8,647,987 B2 | 2/2014 | Yang et al. |
| 8,697,493 B2 | 4/2014 | Sadaka |
| 8,716,105 B2 | 5/2014 | Sadaka et al. |
| 8,802,538 B1 | 8/2014 | Liu |
| 8,809,123 B2 | 8/2014 | Liu et al. |
| 8,841,002 B2 | 9/2014 | Tong |
| 9,093,350 B2 | 7/2015 | Endo et al. |
| 9,142,517 B2 | 9/2015 | Liu et al. |
| 9,171,756 B2 | 10/2015 | Enquist et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,299,736 B2 | 3/2016 | Chen et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,362,143 B2 | 6/2016 | Sun et al. |
| 9,385,024 B2 | 7/2016 | Tong et al. |
| 9,394,161 B2 | 7/2016 | Cheng et al. |
| 9,431,368 B2 | 8/2016 | Enquist et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,239 B1 | 11/2016 | Edelstein et al. |
| 9,536,848 B2 | 1/2017 | England et al. |
| 9,559,081 B1 | 1/2017 | Lai et al. |
| 9,620,481 B2 | 4/2017 | Edelstein et al. |
| 9,656,852 B2 | 5/2017 | Cheng et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,799,587 B2 | 10/2017 | Fujii et al. |
| 9,852,988 B2 | 12/2017 | Enquist et al. |
| 9,871,014 B2 | 1/2018 | Haba |
| 9,893,004 B2 | 2/2018 | Yazdani |
| 9,899,442 B2 | 2/2018 | Katkar |
| 9,929,050 B2 | 3/2018 | Lin |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,204,893 B2 | 2/2019 | Uzoh et al. |
| 10,269,756 B2 | 4/2019 | Uzoh |
| 10,276,619 B2 | 4/2019 | Kao et al. |
| 10,276,909 B2 | 4/2019 | Huang et al. |
| 10,418,277 B2 | 9/2019 | Cheng et al. |
| 10,446,456 B2 | 10/2019 | Shen et al. |
| 10,446,487 B2 | 10/2019 | Huang et al. |
| 10,446,532 B2 | 10/2019 | Uzoh et al. |
| 10,508,030 B2 | 12/2019 | Katkar et al. |
| 10,522,499 B2 | 12/2019 | Enquist et al. |
| 10,707,087 B2 | 7/2020 | Uzoh et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,037,919 B2 | 6/2021 | Uzoh et al. |
| 11,056,348 B2 | 7/2021 | Theil |
| 11,069,734 B2 | 7/2021 | Katkar |
| 11,088,099 B2 | 8/2021 | Katkar et al. |
| 11,127,738 B2 | 9/2021 | DeLaCruz et al. |
| 11,158,573 B2 | 10/2021 | Uzoh et al. |
| 11,158,606 B2 | 10/2021 | Gao et al. |
| 11,169,326 B2 | 11/2021 | Huang et al. |
| 11,171,117 B2 | 11/2021 | Gao et al. |
| 11,176,450 B2 | 11/2021 | Teig et al. |
| 11,195,748 B2 | 12/2021 | Uzoh et al. |
| 11,205,625 B2 | 12/2021 | DeLaCruz et al. |
| 11,244,920 B2 | 2/2022 | Uzoh |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,296,044 B2 | 4/2022 | Gao et al. |
| 11,329,034 B2 | 5/2022 | Tao et al. |
| 11,348,898 B2 | 5/2022 | DeLaCruz et al. |
| 11,355,404 B2 | 6/2022 | Gao et al. |
| 11,355,443 B2 | 6/2022 | Huang et al. |
| 11,367,652 B2 | 6/2022 | Uzoh et al. |
| 11,380,597 B2 | 7/2022 | Katkar et al. |
| 11,385,278 B2 | 7/2022 | DeLaCruz et al. |
| 11,387,202 B2 | 7/2022 | Haba et al. |
| 11,387,214 B2 | 7/2022 | Wang et al. |
| 11,476,213 B2 | 10/2022 | Haba et al. |
| 2004/0084414 A1 | 5/2004 | Sakai et al. |
| 2006/0057945 A1 | 3/2006 | Hsu et al. |

(56) References Cited

U.S. PATENT DOCUMENTS

| | | | |
|---|---|---|---|
| 2007/0111386 A1 | 5/2007 | Kim et al. | |
| 2007/0148949 A1* | 6/2007 | Suh | H01L 24/13 |
| | | | 257/E21.511 |
| 2013/0092426 A1 | 4/2013 | Wu | |
| 2014/0105674 A1 | 4/2014 | Hayashi et al. | |
| 2014/0175655 A1 | 6/2014 | Chen et al. | |
| 2014/0217610 A1* | 8/2014 | Jeng | H01L 21/4857 |
| | | | 257/774 |
| 2015/0017763 A1 | 1/2015 | Haba et al. | |
| 2015/0064498 A1 | 3/2015 | Tong | |
| 2016/0250710 A1 | 9/2016 | Starkovich et al. | |
| 2016/0343682 A1 | 11/2016 | Kawasaki | |
| 2017/0179061 A1 | 6/2017 | Arvin et al. | |
| 2018/0175012 A1 | 6/2018 | Wu et al. | |
| 2018/0182639 A1 | 6/2018 | Uzoh et al. | |
| 2018/0182666 A1 | 6/2018 | Uzoh et al. | |
| 2018/0190580 A1 | 7/2018 | Haba et al. | |
| 2018/0190583 A1 | 7/2018 | DeLaCruz et al. | |
| 2018/0219038 A1 | 8/2018 | Gambino et al. | |
| 2018/0323177 A1 | 11/2018 | Yu et al. | |
| 2018/0323227 A1 | 11/2018 | Zhang et al. | |
| 2018/0331066 A1 | 11/2018 | Uzoh et al. | |
| 2019/0115277 A1 | 4/2019 | Yu et al. | |
| 2019/0131277 A1 | 5/2019 | Yang et al. | |
| 2019/0333550 A1 | 10/2019 | Fisch | |
| 2019/0385935 A1 | 12/2019 | Gao et al. | |
| 2019/0385966 A1 | 12/2019 | Gao et al. | |
| 2020/0013637 A1 | 1/2020 | Haba | |
| 2020/0013765 A1 | 1/2020 | Fountain, Jr. et al. | |
| 2020/0035641 A1 | 1/2020 | Fountain, Jr. et al. | |
| 2020/0075553 A1 | 3/2020 | DeLaCruz et al. | |
| 2020/0294908 A1 | 9/2020 | Haba et al. | |
| 2020/0328162 A1 | 10/2020 | Haba et al. | |
| 2020/0328164 A1 | 10/2020 | DeLaCruz et al. | |
| 2020/0395321 A1 | 12/2020 | Katkar et al. | |
| 2020/0411483 A1 | 12/2020 | Uzoh et al. | |
| 2021/0098412 A1 | 4/2021 | Haba et al. | |
| 2021/0118864 A1 | 4/2021 | DeLaCruz et al. | |
| 2021/0143125 A1 | 5/2021 | DeLaCruz et al. | |
| 2021/0181510 A1 | 6/2021 | Katkar et al. | |
| 2021/0193603 A1 | 6/2021 | DeLaCruz et al. | |
| 2021/0193624 A1 | 6/2021 | DeLaCruz et al. | |
| 2021/0193625 A1 | 6/2021 | Katkar et al. | |
| 2021/0242152 A1 | 8/2021 | Fountain, Jr. et al. | |
| 2021/0296282 A1 | 9/2021 | Gao et al. | |
| 2021/0305202 A1 | 9/2021 | Uzoh et al. | |
| 2021/0366820 A1 | 11/2021 | Uzoh | |
| 2021/0407941 A1 | 12/2021 | Haba | |
| 2022/0077063 A1 | 3/2022 | Haba | |
| 2022/0077087 A1 | 3/2022 | Haba | |
| 2022/0139867 A1 | 5/2022 | Uzoh | |
| 2022/0139869 A1 | 5/2022 | Gao et al. | |
| 2022/0208650 A1 | 6/2022 | Gao et al. | |
| 2022/0208702 A1 | 6/2022 | Uzoh | |
| 2022/0208723 A1 | 6/2022 | Katkar et al. | |
| 2022/0246497 A1 | 8/2022 | Fountain, Jr. et al. | |
| 2022/0285303 A1 | 9/2022 | Mirkarimi et al. | |
| 2022/0319901 A1 | 10/2022 | Suwito et al. | |
| 2022/0320035 A1 | 10/2022 | Uzoh et al. | |
| 2022/0320036 A1 | 10/2022 | Gao et al. | |
| 2023/0005850 A1 | 1/2023 | Fountain, Jr. | |
| 2023/0019869 A1 | 1/2023 | Mirkarimi et al. | |
| 2023/0036441 A1 | 2/2023 | Haba et al. | |
| 2023/0067677 A1 | 3/2023 | Lee et al. | |
| 2023/0069183 A1 | 3/2023 | Haba | |
| 2023/0100032 A1 | 3/2023 | Haba et al. | |
| 2023/0115122 A1 | 4/2023 | Uzoh et al. | |
| 2023/0122531 A1 | 4/2023 | Uzoh | |
| 2023/0123423 A1 | 4/2023 | Gao et al. | |
| 2023/0125395 A1 | 4/2023 | Gao et al. | |
| 2023/0130259 A1 | 4/2023 | Haba et al. | |
| 2023/0132632 A1 | 5/2023 | Katkar et al. | |
| 2023/0140107 A1 | 5/2023 | Uzoh et al. | |
| 2023/0142680 A1 | 5/2023 | Guevara et al. | |
| 2023/0154816 A1 | 5/2023 | Haba et al. | |
| 2023/0154828 A1 | 5/2023 | Haba et al. | |
| 2023/0187264 A1 | 6/2023 | Uzoh et al. | |
| 2023/0187317 A1 | 6/2023 | Uzoh | |
| 2023/0187412 A1 | 6/2023 | Gao et al. | |
| 2023/0197453 A1 | 6/2023 | Fountain, Jr. et al. | |
| 2023/0197496 A1 | 6/2023 | Theil | |
| 2023/0197559 A1 | 6/2023 | Haba et al. | |
| 2023/0197560 A1 | 6/2023 | Katkar et al. | |
| 2023/0197655 A1 | 6/2023 | Theil et al. | |
| 2023/0207402 A1 | 6/2023 | Fountain, Jr. et al. | |
| 2023/0207437 A1 | 6/2023 | Haba | |
| 2023/0207474 A1 | 6/2023 | Uzoh et al. | |
| 2023/0207514 A1 | 6/2023 | Gao et al. | |
| 2023/0215836 A1 | 7/2023 | Haba et al. | |
| 2023/0245950 A1 | 8/2023 | Haba et al. | |
| 2023/0268300 A1 | 8/2023 | Uzoh et al. | |
| 2023/0299029 A1 | 9/2023 | Theil et al. | |
| 2023/0343734 A1 | 10/2023 | Uzoh et al. | |
| 2023/0360950 A1 | 11/2023 | Gao | |
| 2023/0361074 A1 | 11/2023 | Uzoh et al. | |
| 2023/0369136 A1 | 11/2023 | Uzoh et al. | |
| 2023/0375613 A1 | 11/2023 | Haba et al. | |
| 2024/0038702 A1 | 2/2024 | Uzoh | |
| 2024/0055407 A1 | 2/2024 | Workman | |
| 2024/0079376 A1 | 3/2024 | Suwito et al. | |
| 2024/0170411 A1 | 5/2024 | Chang et al. | |
| 2024/0186248 A1 | 6/2024 | Haba et al. | |
| 2024/0186268 A1 | 6/2024 | Uzoh et al. | |
| 2024/0186269 A1 | 6/2024 | Haba | |
| 2024/0203917 A1 | 6/2024 | Katkar et al. | |
| 2024/0213191 A1 | 6/2024 | Theil et al. | |
| 2024/0213210 A1 | 6/2024 | Haba et al. | |
| 2024/0217210 A1 | 7/2024 | Zhao et al. | |
| 2024/0222239 A1 | 7/2024 | Gao et al. | |
| 2024/0222315 A1 | 7/2024 | Uzoh | |
| 2024/0222319 A1 | 7/2024 | Gao et al. | |

FOREIGN PATENT DOCUMENTS

| | | |
|---|---|---|
| KR | 20160036571 | 4/2016 |
| WO | WO 2005/043584 A2 | 5/2005 |
| WO | WO 2016/010841 A1 | 1/2016 |

OTHER PUBLICATIONS

Hiramatsu et al., "Aligned growth of single-walled and double-walled carbon nanotube films by control of catalyst preparation," Ch. 10 of the Book: "Carbon Nanotubes—Synthesis, Characterization, Applications, " edited by Siva Yellampalli, ISBN 978-953-307-497-9, Jul. 20, 2011, 26 pages.

International Search Report and Written Opinion dated Jun. 18, 2020, for International Application No. PCT/US2020/017715, 10 pages.

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Moriceau, H et al., "Overview of recent direct wafer bonding advances and applications," Advances in Natural Sciences-Nanoscience and Nanotechnology, 2010, 11 pages.

Nakanishi, H. et al., "Studies on SiO2—SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (I), 6 pages.

Plobi, A. et al., "Wafer direct bonding: tailoring adhesion between brittle materials," Materials Science and Engineering Review Journal, 1999, R25, 88 pages.

Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

(56) References Cited

OTHER PUBLICATIONS

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

ONSEMI AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, Electronics Weekly.com ("BUSH article"); however, the imaged part and the part shown in the BUSH article share the part number "ONSEMI AR0820.".

SONY IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "SONY IMX260 image."

\* cited by examiner

NANOWIRE BONDING INTERCONNECT FOR FINE-PITCH MICROELECTRONICS

CROSS-REFERENCE TO RELATED APPLICATIONS

This application is a divisional of U.S. patent application Ser. No. 16/776,182, filed on Jan. 29, 2020, and issued as U.S. Pat. No. 11,387,202, which claims priority to U.S. Provisional Patent Application No. 62/812,778 to Haba et al., filed Mar. 1, 2019, the contents of each of which are incorporated by reference herein in their entirety and for all purposes.

BACKGROUND

As microelectronic devices decrease in size, the pitch of line-space patterning for conductive leads and traces in the devices also decreases. Techniques such as direct bond interconnect (DBI®) direct hybrid bonding have been invented to make reliable electrical interconnects at smaller and smaller scales (Ziptronix Inc., a subsidiary of Xperi Corporation, San Jose, CA). Such DBI techniques can accomplish a million separate solderless electrical couplings per square millimeter, under ideal circumstances. Such high joining density calls for careful fabrication conditions and ultra-flat surfaces that are extremely clean. Viable alternatives to DBI direct hybrid bonding techniques for making fine-pitch conductive connections on pads less than 5 µm across are rare, especially when conditions are less than ideal. There is interest in finding new bonding techniques that can make high-density ultra-fine pitch interconnects during fabrication and 3D-packaging of microelectronic devices.

SUMMARY

A nanowire bonding interconnect for fine-pitch microelectronics is provided. Vertical nanowire pins or posts created on conductive pads provide a debris-tolerant bonding layer for making direct metal-to-metal bonds with opposing conductive pads or opposing vias. Nanowires may be grown from a nanoporous medium with a height between approximately 200-1000 nanometers (0.2-1.0 µm) and a height-to-diameter aspect ratio that enables the nanowires to partially collapse against the opposing conductive pads, thereby providing spring compression of the nanowires and contact pressure for conductive contact or direct metallic-bonding to the opposing pads. Nanowires may have diameters less than 200 nanometers and spacing less than 1 µm between each other to enable direct-metallic bonding for pads and vias with diameters under 5 µm, arrayed at very fine pitch. The nanowire bonding interconnects may be used with or without tinning, solders, or adhesives. A nanowire forming technique creates a nanoporous layer on conductive pads or across an entire surface, creates nanowires within pores of the nanoporous layer, and then removes all or at least part of the nanoporous layer to reveal a nanowire bonding layer that may be less than 1 µm in vertical height for direct metallic-bonding between opposing pads or between opposing vias.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

DESCRIPTION

Overview

Figure 1:
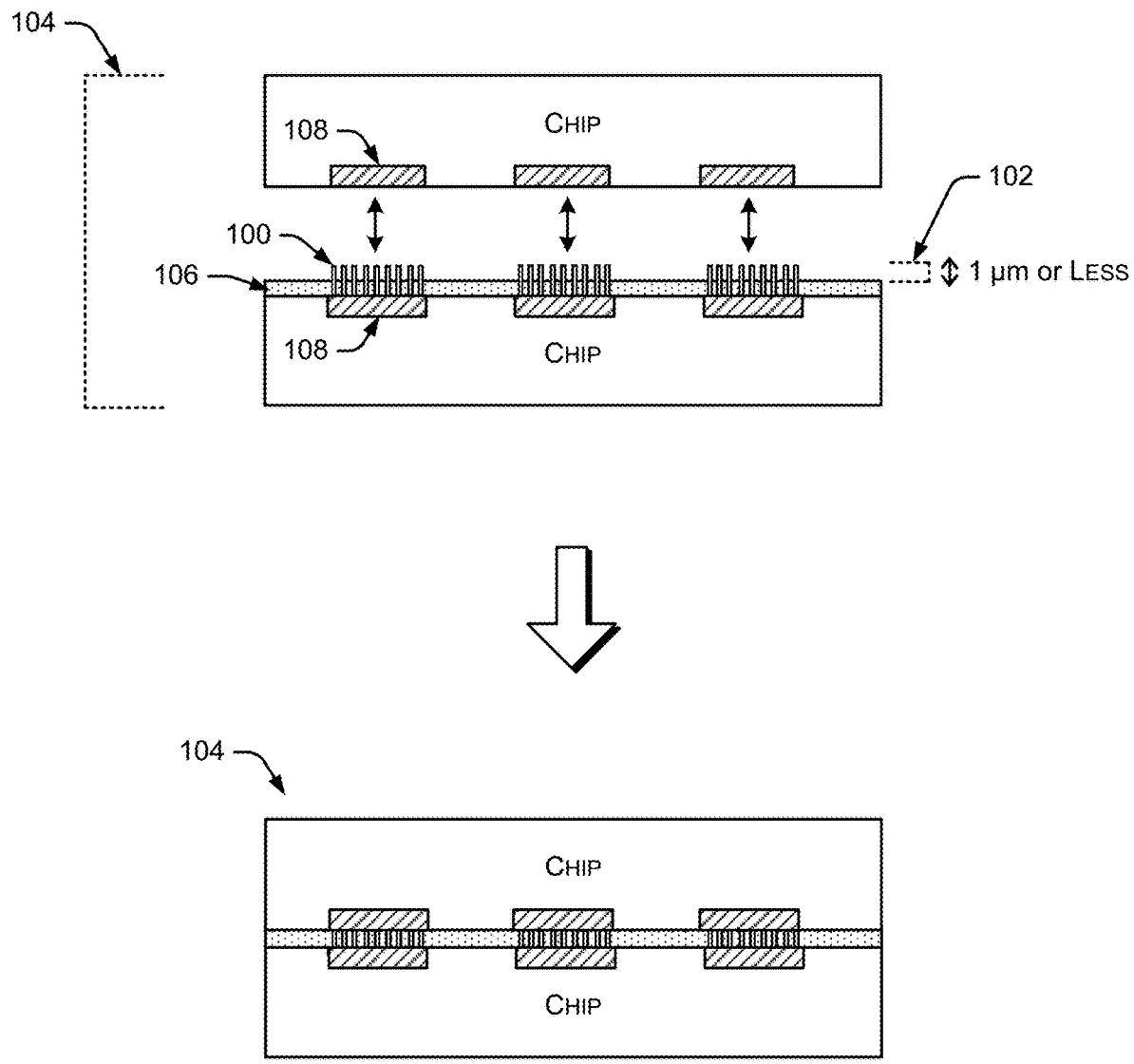
FIG. 1 is a diagram of an example nanowire bonding interface formed on conductive pads of a surface to be bonded.

This disclosure describes a nanowire bonding interconnect for fine-pitch microelectronics. In an implementation, vertical nanowire pins or posts are created on conductive pads of a microelectronics device, or on an entire surface of a chip, wafer, or device to provide a thin debris-tolerant bonding layer that can form interconnects between conductive pads that are less than 5 µm across and laid out at fine-pitch, even in the presence of trace amounts of tiny debris particles. The nanowire bonding interface described herein can be used under ideal conditions, but can also be used in some circumstances when conductive pads or leads to be bonded together are not ideal candidates for conventional direct bonding, due to lesser quality of the conductive surfaces being bonded, variance in the flatness needed for direct bonding, or imperfect surface preparation for conventional direct bonding techniques.

Nanowires with a diameter less than 200 nanometers (nm) and a horizontal spacing from each other of 1 µm or less enable conductive contact or direct metal-to-metal bonding between pads that have dimensions under 5 µm and comparable line and pitch (spacing) distances. The small diameter of the nanowires at 200 nm or less enables conductive pads much smaller than 5 µm to still have at least 3-4 nanowires 100 on their surface. The nanowires may be grown from a nanoporous medium with a height between approximately 200-1000 nanometers, for example, and a height-to-diameter aspect ratio that enables the nanowires to partially collapse against the opposing conductive pads under applied pressure, thereby providing a desirable compression of the nanowires and contact pressure for making electrical interconnects and for direct metal-to-metal bonding of the nanowires to the opposing conductive pads or vias. The nanowire bonding interconnects may be used to join surfaces with or without tinning, solders, or adhesives, depending on implementation. Some embodiments use flowable joining materials, solder, or an adhesive to join devices, dies, or surfaces on either side of the vertically disposed nanowires.

The nanowire bonding layer can be implemented on conductive pads only, or can be implemented on an entire surface of a semiconductor wafer, silicon substrate, semiconductor die, chip, package, assembly, dielectric, or even just on a surface that has electrical contacts. The nanowire bonding layer can also be embodied in a two-sided interposer that can bond chips and wafers on both sides of the two-sided interposer.

Techniques for forming the nanowire bonding interface are also described. An example method creates a nanoporous layer of a nonmetal, for example, on each conductive pad of a surface to be bonded. Nanowires are plated, deposited, or otherwise formed within the pores of the nanoporous layer, and then at least a part of the nanoporous layer may be removed, or recessed, to reveal a layer of bondable nanowire ends that may be less than 1 µm in height for direct metallic-bonding between opposing pads or between opposing vias, in one example process.

Dimensions of the nanowires for their diameter and height may be selected so that a pressure force needed to electrically interconnect two opposing pads and collapse the nanowires into a slightly compressed state is less than the yielding force of the same bulk materials used.

Example Bonding Interfaces

Dimensions of members and elements shown in the Figures are not to scale and not in proportion relative to each other, but are shown in a manner that aids in understanding the description of features.

FIG. 1 shows example nanowires 100 ("pins" or "posts") making up an example nanowire bonding interface 102. The nanowire bonding interface 102 may be used to make a microelectronics package 104 that includes a die-to-die, die-to-wafer, or wafer-to-wafer interface between two components of the microelectronic package 104. The nanowires 100 are grown from a nanoporous medium 106, for example made of a dielectric material, and may be formed or grown only on conductive pads 108 to be bonded, or may be formed across the entire surface to be bonded or joined. In an implementation, the nanowires 100 may be grown on conductive pads 108 on opposing surfaces to be bonded, and the nanowires 100 on each side bond to the conductive pads 108 and nanowires 100 on the opposing side of the bond.

The nanowires 100 can be made of copper, nickel, aluminum, silver, tungsten, alloy, or another suitable electrical conductor. The nanowires 100 can also be covered, coated, alloyed, or amalgamated with other metals, such as gold or other metals attractive for bonding, soldering, or making a multi-metal intermetallic bonding interface between conductors that are being joined into an interconnect.

In an implementation, formation of the nanowires 100 uses a nanoporous film or layer 106. This nanoporous starting layer 106 can be made of porous silicon, oxidized alumina, silicon dioxide, ceramic, or a host of other materials, such as various dielectric materials. Moreover, the nanoporous starting layer 106 does not need to be porous from the outset. A suitable material is applied to the chip, wafer, or other surface, and the pores can be created by various techniques, such as electrochemical etching, chemical vapor deposition, sputtering, alkali corrosion, and many other processes for creating nanoporous films and surfaces.

In an implementation, the nanowires 100 are formed, plated, deposited, or grown in the pores of the nanoporous layer 106. This formation process may include depositing a film of insulator material on the walls of the pores, in the event that the nanoporous layer 106 itself is conductive, or is semiconductive, as in the case of silicon. The nanowire formation process may also include cleaning the bottom of the pores, in order for the nanowires 100 being created to make electrical contact with the conductive pads underlying the nanoporous layer 106. Once nanowires 100 of a desired vertical height are formed, the nanoporous layer 106 may be partially or completely removed, or recessed, providing "free" ends of the nanowires 100 for bonding with an opposing conductive pad 108, or another opposing instance of the nanowire bonding interface 102, on the opposing side of the bond. The nanowires 100 can be made any height or length, but a useful height in one example implementation is between approximately 200-1000 nanometers (e.g., up to 1 µm). The free ends of the nanowires 100 can make conductive contact via simple physical contact or by direct metal bonding of the ends to a conductive surface. Optionally a flowable joining material such as a solder may be used. In an implementation, the nanowires 100 can be held in contact with permanent adhesive that is placed elsewhere on the surfaces being joined away from the nanowires 100, or in an implementation, the adhesive may be mixed in with the nanowires 100 in areas where the nanowires 100 make electrical contact with an opposing pad 108. The nanowires 100 may bend, kink, and/or conform to small debris particles, leaving the remaining nanowires 100 to bond. The bonding nanowires 100 compress to a degree, provide some contact pressure against the opposing pad 108 for electrical contact and for direct metal bonding.

The completed nanowire bonding interface 102, including both the nanowires 100 and the nanoporous layer 106, may sometimes be only 1 µm or less in vertical height. This height, or a similar height, is enough to provide a more forgiving bonding approach when micro-particles are present than conventional surface-to-surface direct bonding, which uses ultra-flat and ultra-clean prepared bonding surfaces that are flatly planar.

In an implementation, since the nanowires 100, on average, are only about 1 µm apart from each other horizontally, and sometimes much less, the nanowire bonding interface 102 can form interconnects at pitches much smaller than 5 μm.

Figure 2:
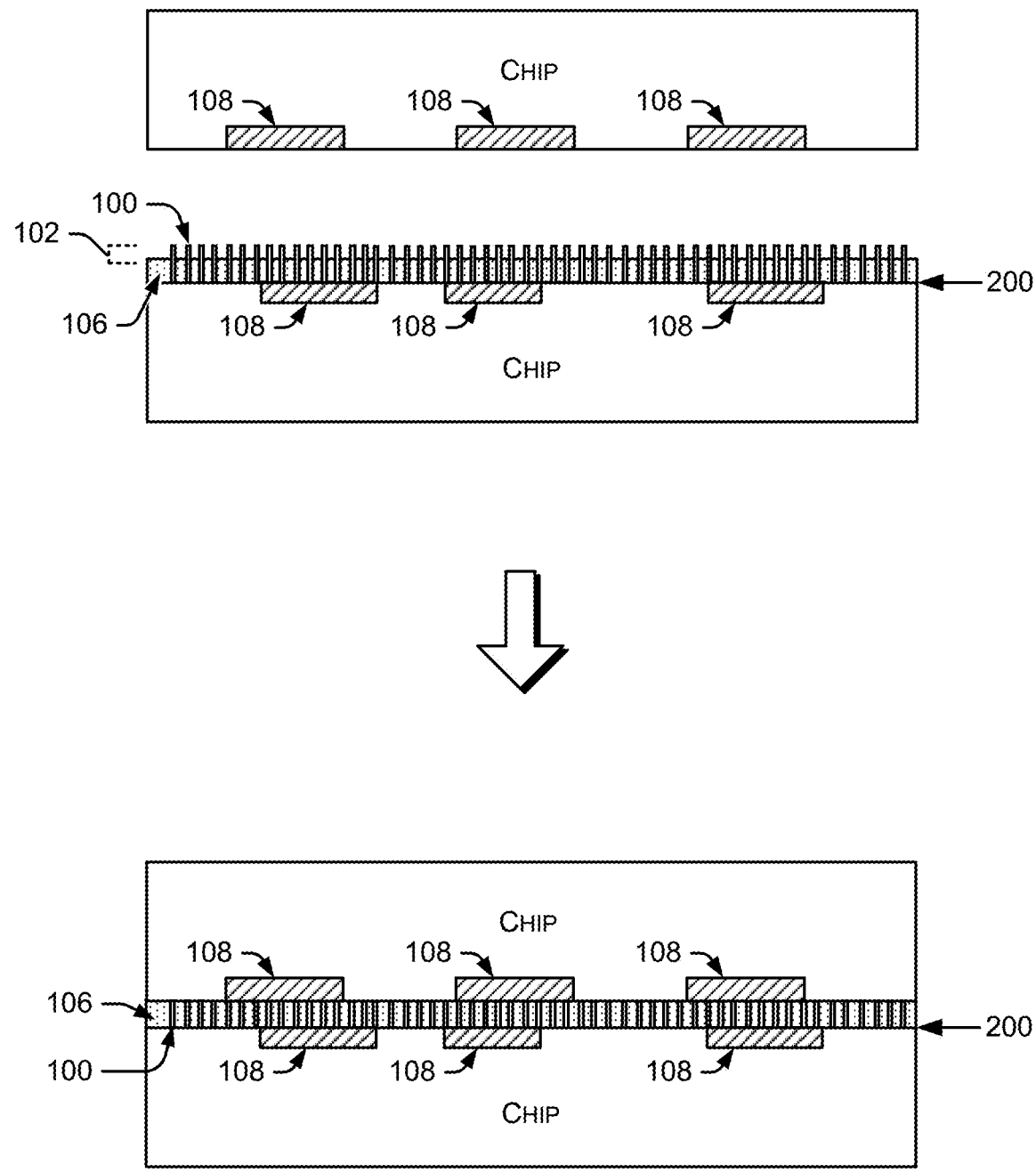
FIG. 2 is a diagram of an example nanowire bonding interface formed across an entire surface to be bonded.

FIG. 2 shows an implementation of the nanowire bonding interface 102, in which nanowires 100 and a nanoporous layer 106 have been created on an entire surface 200 to be bonded. Coating an entire surface 200 with the nanowires 100 can sometimes be easier than the scenario of FIG. 1, in which the nanowires 100 are only grown on conductors 108 that make an electrical interconnect between conductive pads on opposing surfaces being joined. Coating an entire surface with the nanowires 100, as in FIG. 2, can also be used to make stronger cumulative bonds between two surfaces being joined, and can allow full physical bonding between surfaces, even with conductive pads that have some vertical misalignment with respect to their electrical interconnection.

Figure 3:
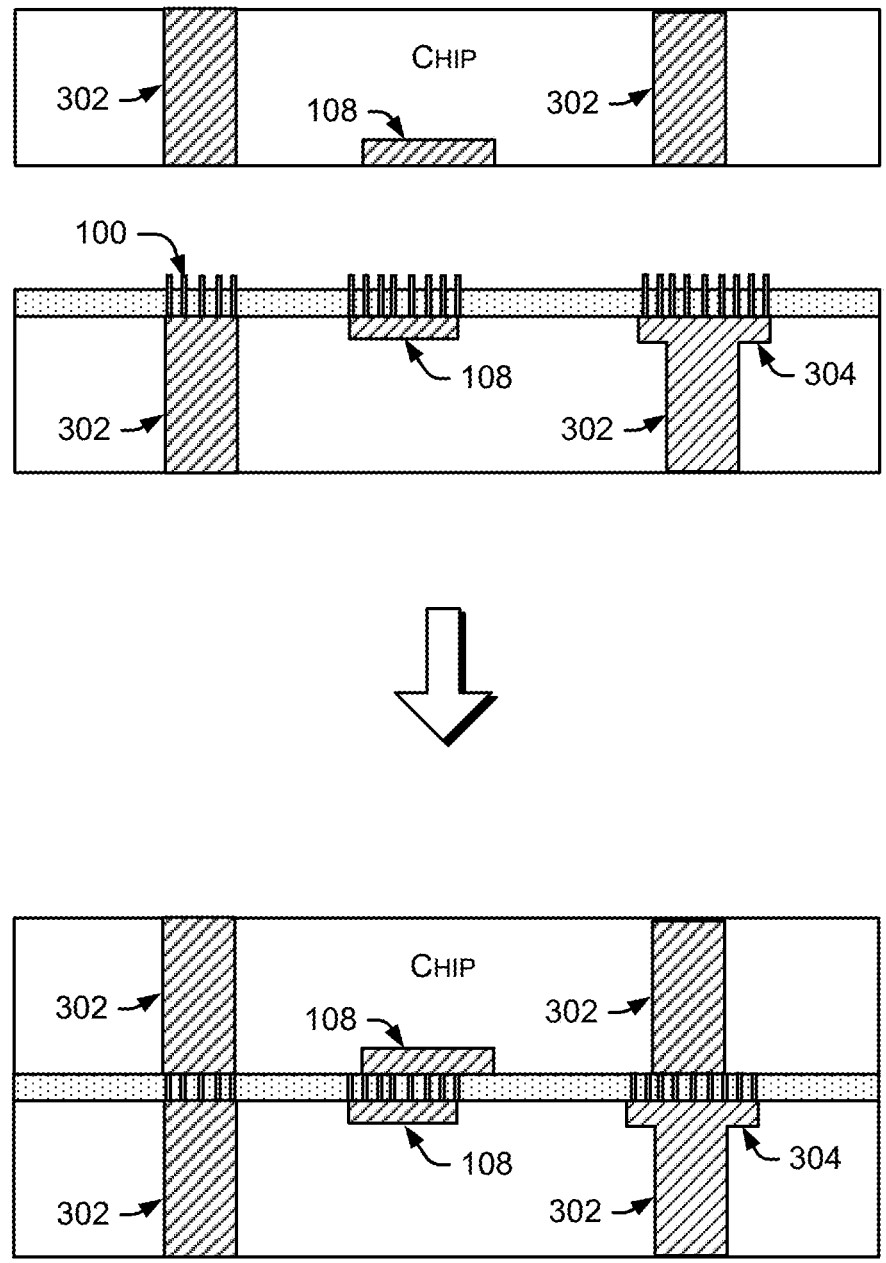
FIG. 3 is a diagram of an example nanowire bonding interface formed on through-silicon-vias (TSVs) at a surface to be bonded.

FIG. 3 shows example nanowires 100 formed on pads 108, on through-silicon-vias (TSVs) 302, or on both pads 108 and TSVs 302. Moreover, the TSVs 302 can also be outfitted with TSV pads 304 of their own, at the bonding interface. Nanowires 100 that do not connect vertically with an opposing pad 108, TSV 302, or opposing TSV pad 304 merely kink, bend, collapse, or break against an opposing surface of insulator or dielectric.

Figure 4:
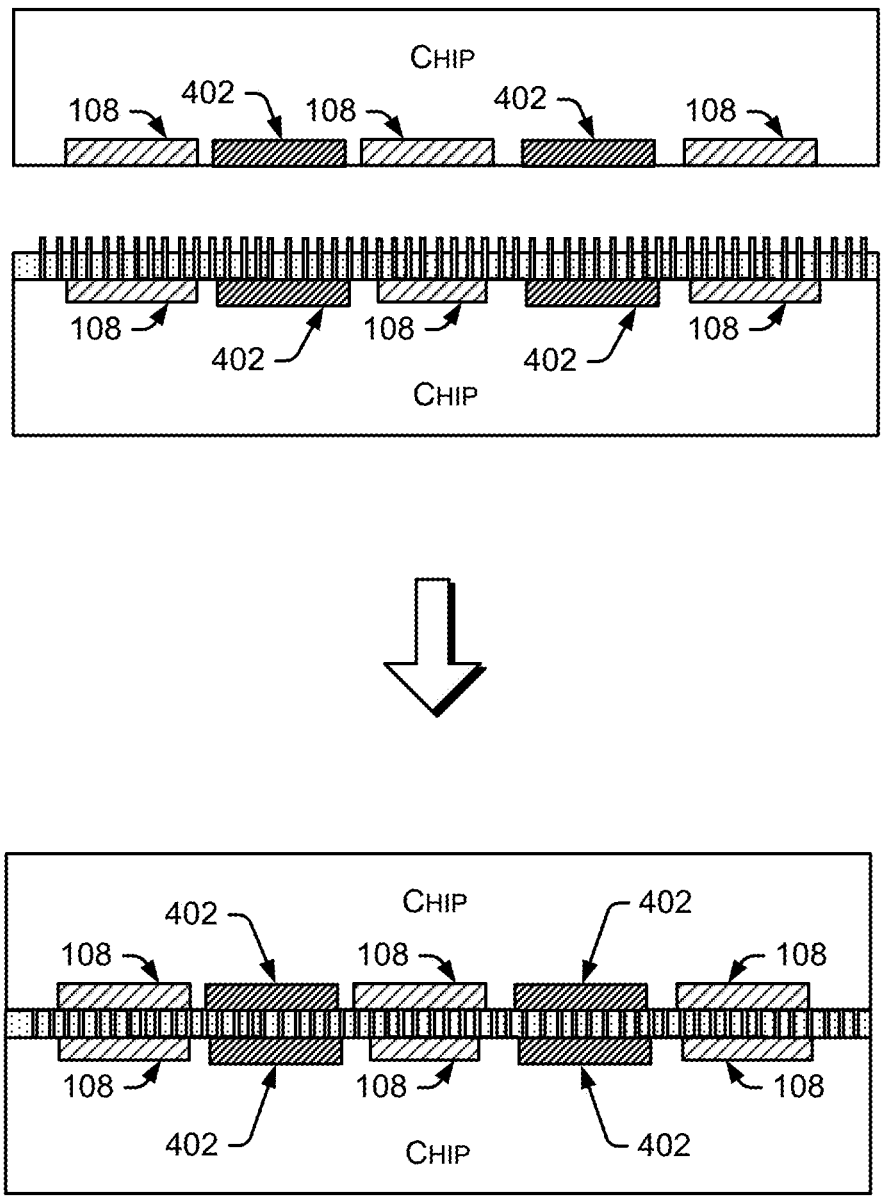
FIG. 4 is a diagram of example extra dummy bonding pads on surfaces to be bonded across a nanowire bonding interface.

FIG. 4 shows an example implementation in which additional metal pads 402 that are not necessarily involved in circuitry or conductive connection can be designed onto a surface, horizontally between the conductive pads 108 in order to form a stronger vertical bond between surfaces being joined, using the nanowires 100 at both types of pads, pads 108 and pads 402. The extra "dummy" pads 402 may also be used for heat-sinking, as the nanowires 100 are excellent conduits for flowing thermal energy generated by an integrated circuit of a die or heat generated within the larger microelectronics package 104 to a heat sink or to a dissipating structure.

Figure 5:
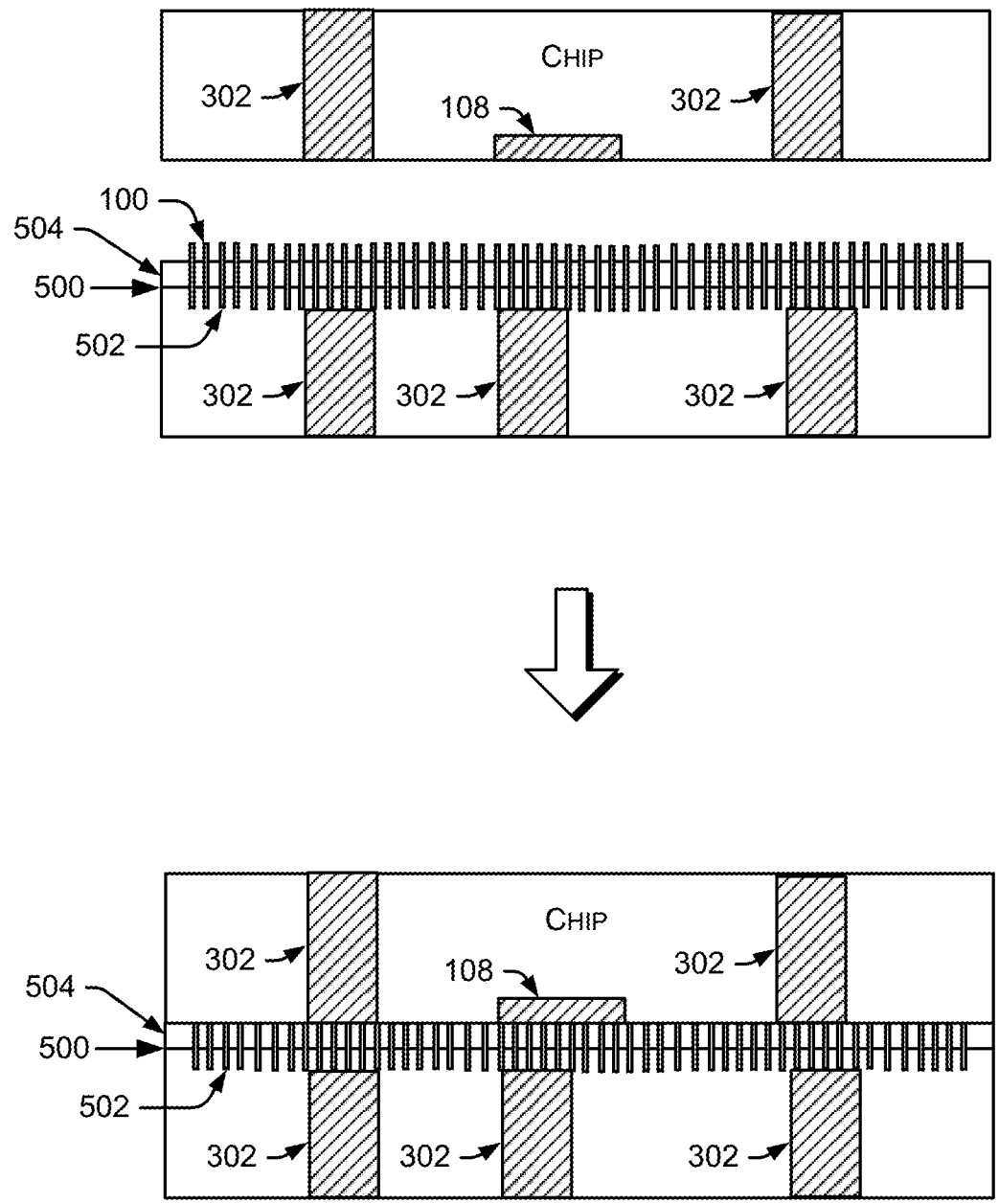
FIG. 5 is a diagram of example nanowires embedded directly in a chip substrate for making a nanowire bonding interface.

FIG. 5 shows another implementation of an example bonding interface, in which the nanowires 100 are formed or "embedded" 502 in a surface 500 of the die itself, with no extra nanoporous layer 106 added in the nanowire 100 formation process. This can be accomplished by performing one of the nanopore-creating techniques described above, directly on the silicon semiconductor material or on a substrate material of a die, wafer, or other surface. A layer of adhesive 504 that has less height than the vertical height of the nanowires 100 may be added for joining the surfaces together. The joining may be made under pressure, so that the nanowires 100 can contact opposing pads 108 under some compression and contact pressure, while the adhesive 504 sets or hardens, making the contact between nanowires 100 and the contact pads 108 permanent.

Figure 6:
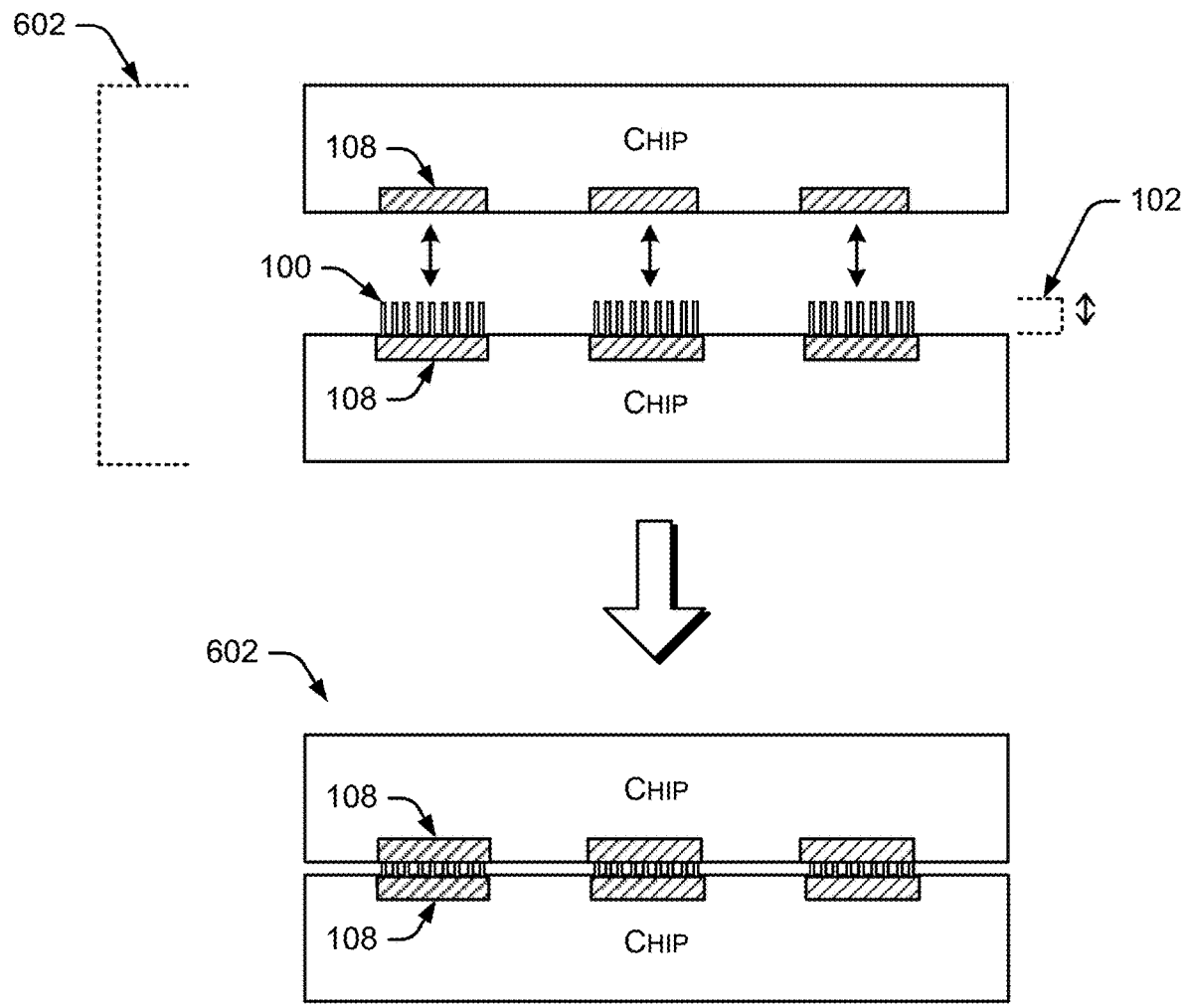
FIG. 6 is a diagram of an example nanowire bonding interface in which the nanporous layer used to form the nanowires has been removed after the nanowires are formed.

FIG. 6 shows an implementation of the nanowire bonding interface 102 in which the nanoporous layer 106 used to form the nanowires 100 has been removed after the nanowires 100 are formed. This configuration allows the metal of the nanowires 100 to direct-bond with the same metal used in an opposing contact pad 108, with no other material between conductive pads 108 besides the nanowires 100, and air. Such direct metal bonds make the electrical interconnects between conductive pads 108 and can also provide the physical joining bond or mechanical connection between the two surfaces, such as between dies, or between die and wafer. In implementations where the nanoporous layer 106 is to be removed, a removable material is used. Removal of the nanoporous layer 106 depends on what substance is used as the nanoporous layer 106. A masking material, or other etchable material can be used, such as an organic photoresist, silicon, or silicon dioxide, for example. Chemical, photo, or plasma etching may be used, depending on material, leaving the nanowires 100 freestanding, although only approximately a micron in height. Some forms of alumina (aluminum oxide) can be made removable. In this implementation, the joined package 602 has no remaining nanoporous layer 106 (FIG. 1).

Figure 7:
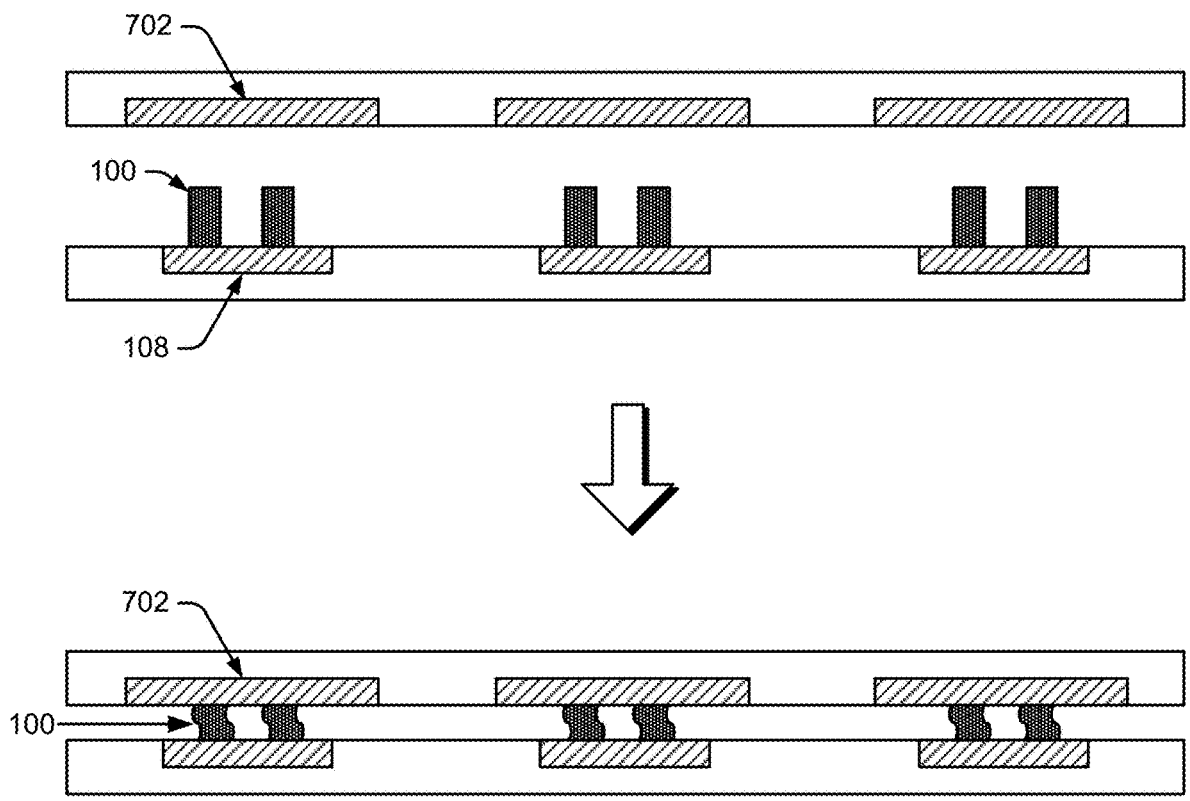
FIG. 7 is a diagram of example nanowires before and after bonding with an opposing pad.

FIG. 7 shows the nanowires 100 before and after bonding with an opposing pad 702. When the conductive pads 108 & 702 are small, such as less than 5 μm in length or diameter, then each pad 108 & 702 may still have 2-4 nanowires 100, since the nanowires 100 may have a diameter of 200 nm, and a spacing of less than 1 μm, with the average height of the nanowires 100 approximately 1 μm or less. The two surfaces to be joined are brought together with enough pressure to press the nanowires 100 down to a common level of the lowest nanowires 100 in vertical height. The nanowires 100 may vary in height between 5-10%. When pressed, the nanowires 100 collapse slightly under the compression. This compressed state gives the nanowires 100 a measure of springlike contact pressure against the opposing conductive pad 702. This implementation may be used with (FIG. 8) or without an adhesive that makes the join permanent, including the compressed nanowires 100. The compressed nanowires 100 with their contact pressure against the opposing conductive pad 702 may form their own direct metal-to-metal bonds with the opposing conductive pad 702. The two surfaces may be held together by the direct bonds formed between the nanowires 100 and the opposing conductive pad 702, or alternatively or in addition the surfaces may be held together by mechanical force or by an adhesive (as in FIG. 8).

Figure 8:
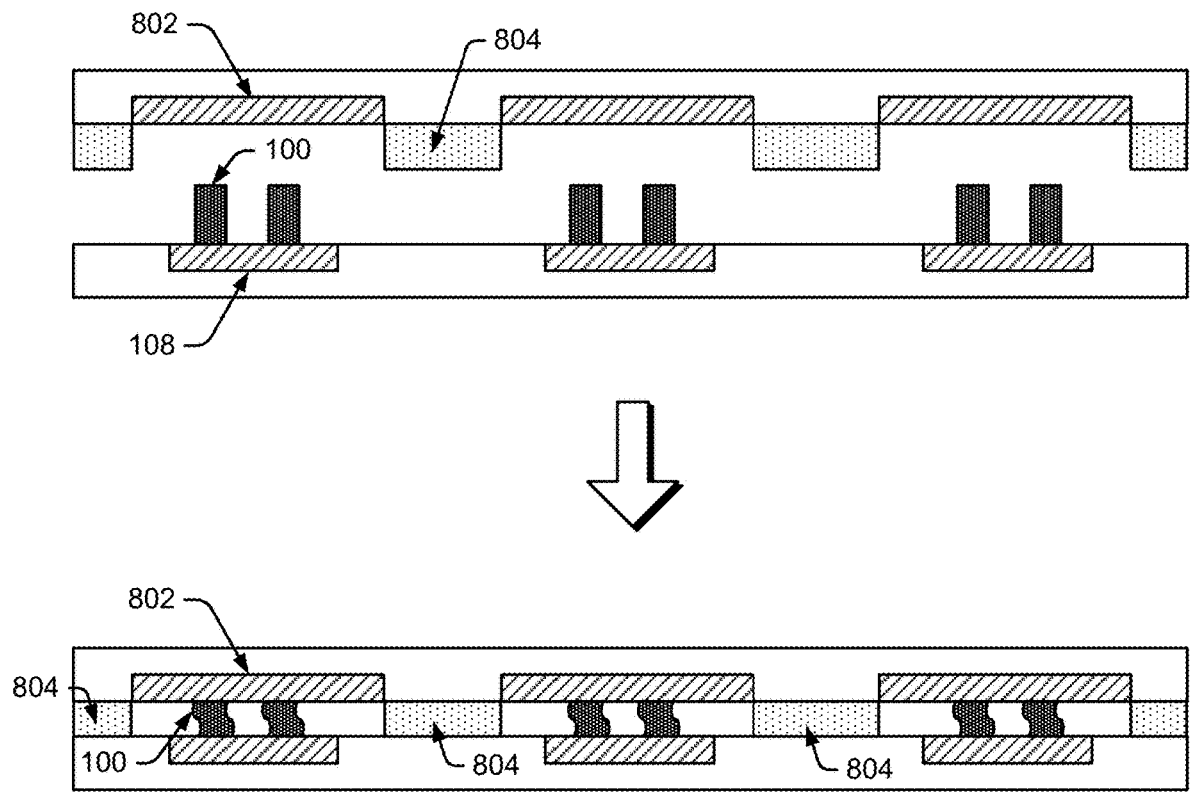
FIG. 8 is a diagram of example nanowires before and after bonding with an opposing pad in the presence of an adhesive.

FIG. 8 shows the nanowires 100 before and after bonding with an opposing pad 802. In this implementation, the joining is made permanent with an adhesive 804. The height of the shortest nanowire 100 should be greater in height over the top dielectric surface of its die or wafer than the thickness of the dielectric or adhesive 804 layer on the opposing chip, in order for the nanowire 100 to reach the opposing conductive pad 802. Overall, the average height of the nanowires 100 may be approximately 1 μm or less. The conductive pads 108 & 802 on each side of the join may be horizontally smaller than 5 μm in length or diameter, but each pad 108 & 802 still has at least several of the nanowires 100, since the nanowires 100 can have diameters of 200 nm or less, and a spacing of 1 μm or less from each other. The two surfaces to be joined are brought together with pressure enough to compress the nanowires 100 down to a level of the lowest nanowires 100 in vertical height. The nanowires 100 may vary in height between 5-10%. When pressured, the nanowires 100 compress slightly under the pressure. This compressed state provides contact pressure for the nanowires 100 against the opposing conductive pad 802. In FIG. 8, the adhesive 804 is placed only between areas of both surfaces that do have nanowires 100 to be bonded. The adhesive 804 then sets or hardens under compression, fixing the nanowires 100 against the opposing conductive pad 802 in their compressed state. The nanowires 100 may make direct metal-to-metal bonds in their own right, with the opposing contact pad 802, regardless of the adhesive 804 holding the surfaces together.

Figure 9:
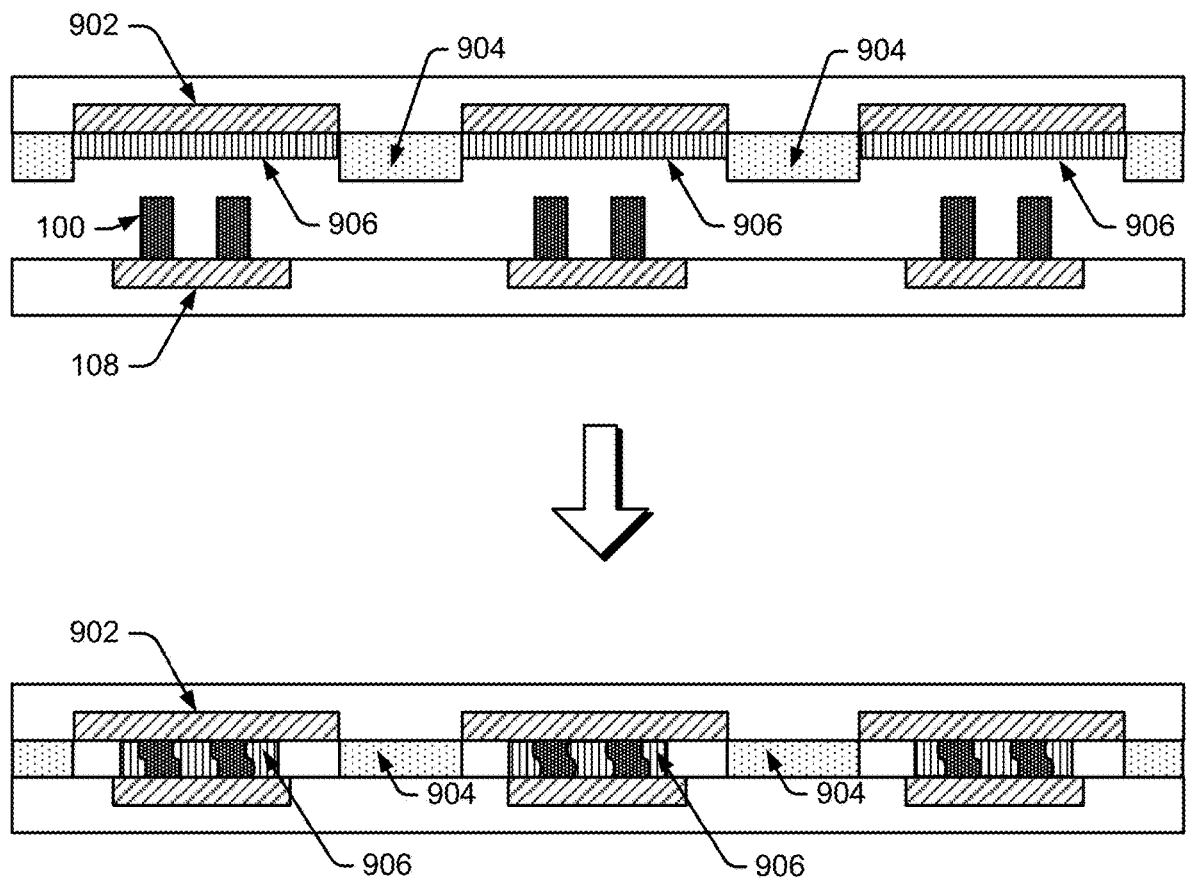
FIG. 9 is a diagram of example nanowires before and after bonding with an opposing pad, in the presence of an adhesive and a solder or flowable joining metal or material.

FIG. 9 shows the nanowires 100 before and after bonding with an opposing pad 902, with both adhesive 904 and a flowable joining material such as solder 906 present. The height of the smallest nanowire 100 should be higher above than the top dielectric surface of its die or wafer than the height or thickness of the dielectric, adhesive 904, or solder layer 906 on the opposing surface, in order to reach the opposing conductive pad 902. The average height of the nanowires 100 may be approximately 1 μm or less. The conductive pads 108 & 902 on each side of the join may be smaller than 5 μm, but each pad 108 & 902 still has at least several of the nanowires 100, since the nanowires 100 are small too, with diameters less than 200 nm, and a spacing of approximately 1 μm or less from each other.

The two surfaces to be joined are brought together with pressure enough to penetrate the nanowires 100 through the solder layer 906 or other flowable joining material and to compress the nanowires 100 down to a level of the tops of the lowest nanowires 100 in vertical height. If the temperature is to be raised as part of the specific process, then the solder 906 or other joining metal flows over the nanowires 100, and optionally over the pad 108 beneath the nanowires 100. The nanowires 100 may vary in height between 5-10%. When pressed, the nanowires 100 compress slightly under the pressure. This compressed state provides contact pressure for the nanowires 100 against the opposing conductive pad 902. The adhesive 904 may be placed only between areas of both surfaces that do have nanowires 100 to be bonded. The adhesive 904 then sets or hardens under compression, fixing the nanowires 100 against the opposing conductive pad 902 in their compressed state.

The nanowires 100 may make direct metal-to-metal bonds in their own right, with the opposing contact pad 902, regardless of the adhesive 904 holding the surfaces together. The compressed nanowires 100 and their contact pressure against the opposing conductive pad 902 may be made solid with the solder 906, or with a nickel-solder interface, when the solder 906 or other flowable joining material is mixed with the nanowires 100, or placed as a layer on top of the nanowires 100, or placed on the opposing chip, die, or wafer. Other flowable joining materials and combinations of flowable joining materials may also be used.

For nanowire bonding interfaces that include a solder 906, the nanowires 100 may penetrate the malleable solder and may enter into the metal-metal bond formed by the solder and the conductive pad 902 being bonded, while the nanowires 100 horizontally outside the confines of the conductive pads 902 merely conform to the non-metal part of the surface by yielding, including bending, kinking, or breaking. The yielding nanowires 100 up against a nonmetal do not enter into formation of an electrical interconnect.

In an example joining process, the opposing surfaces are aligned until the nanowires 100 touch the opposing conductive pads 902, the temperature is raised, optionally until the joining metal flows, then the backs of the two chips, dies, or wafers are pressed until the adhesive 904 joins the top dielectric surfaces of the chips, dies, or wafers.

Figure 10:
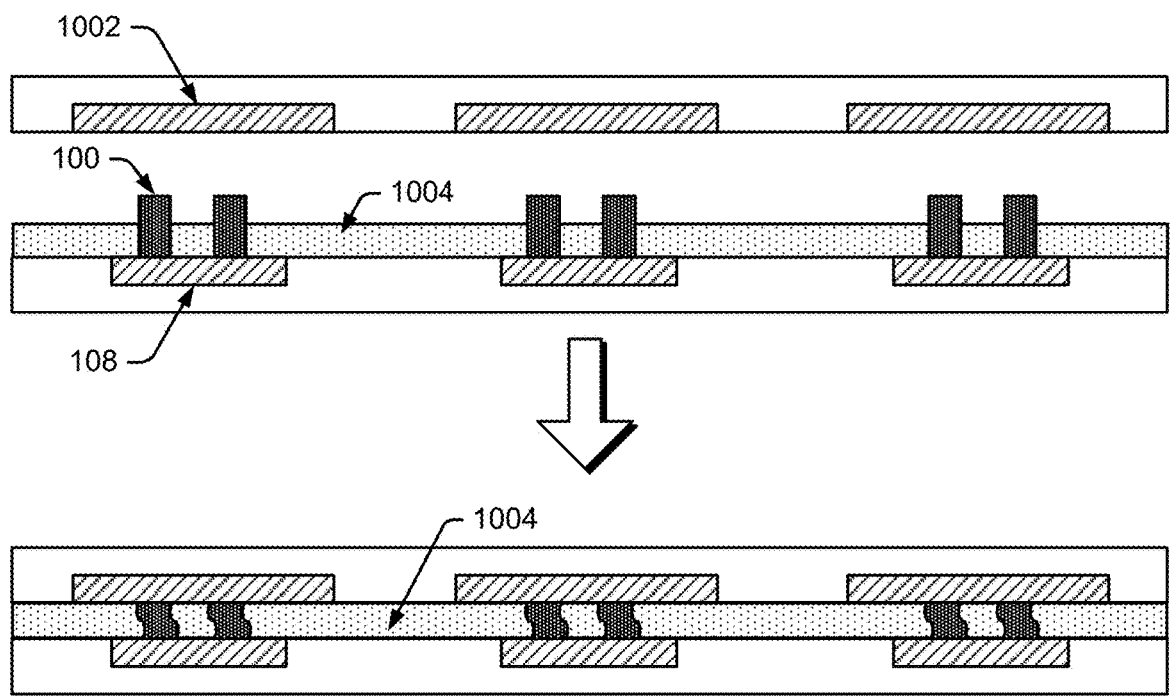
FIG. 10 is a diagram of an example nanowire bonding interface with an adhesive layer placed across an entire area of the surface to be bonded.
Figure 10:
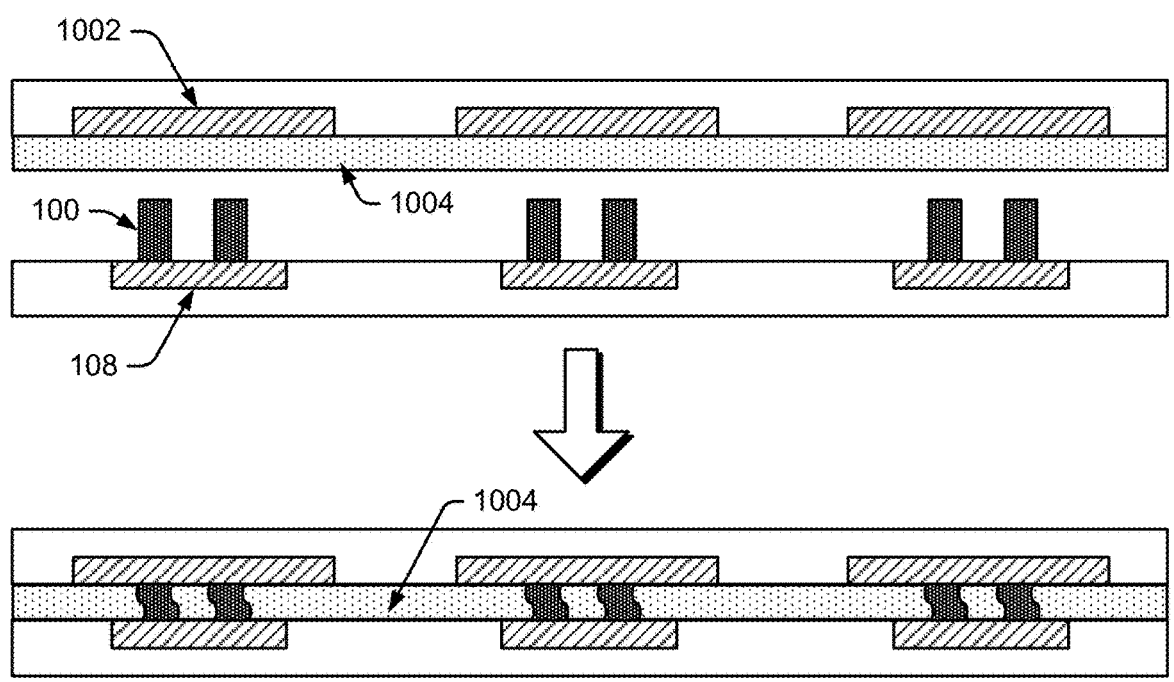

FIG. 10 shows an example nanowire bonding interface with nanowires 100 to be bonded to an opposing conductive pad 1002. An adhesive layer 1004 is placed across an entire area of the surface to be bonded, including in the areas of the nanowires 100 and likewise over areas that have no nanowires 100. The adhesive layer 1004 is of lesser height than the average height of the nanowires 100, so that the ends of the nanowires 100 may contact the opposing conductive pads 1002 without much interference of the adhesive layer 1004, and to prevent an excess volume of the adhesive 1004 interfering with the joining. The adhesive layer 1004 may initially be placed on the same surface as the nanowires 100, or may be placed on the opposing surface, as shown.

Figure 11:
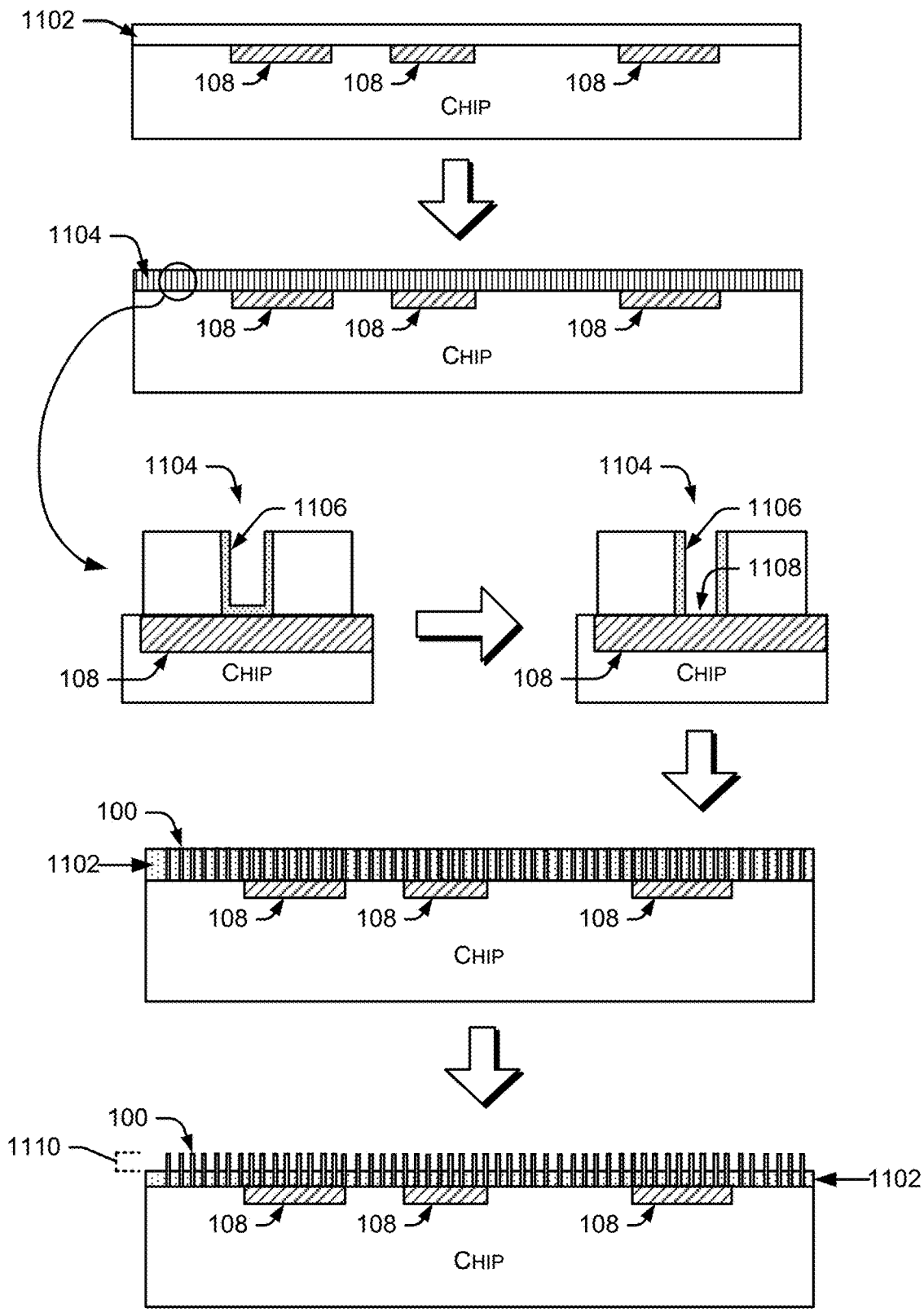
FIG. 11 is a diagram of an example process of fabricating a nanowire bonding interface.

FIG. 11 shows an example fabrication process 1100 in steps. In one implementation of a fabrication process, a thin layer 1102 of a material is deposited on a surface of a die, wafer, or substrate, including upon conductive areas that are to become one or more conductive interconnects. If TSVs are present, then a conductive surface of each TSV is exposed, from the back of the wafer, for example. Pads, such as pads 304 in FIG. 3, may be added to the surface aspect of TSVs 302, if needed.

Pores 1104 are then formed in the deposited material 1102, if the deposited material 1102 is not already nanoporous. If needed, a film of insulator material 1106 is deposited on the walls of the pores 1104, when the deposited material 1102 is a conductor or semiconductor.

Also, if needed, the bottoms 1108 of the pores 1104 are then cleaned as needed, to prepare for good electrical conduction between pads 108 and the conductive nanowires 100 to be formed next.

Next, the pores 1104 are plated or otherwise filled with a metal, such as copper to make the nanowires 100. The nanowires 100 may be formed by deposition, electrolytic plating, electroless plating, crystal growth, and so forth. The nanowires 100 may be grown to an average height, and then planarized if desired to average heights that are within 5-10% of each other. If greater uniformity of height is desired than is present after nanowire growth, the nanowires may be lapped, for example, and ends further plated on the nanowires 100 by electroless plating or other techniques.

Next, the nanoporous layer 1102 may be at least partially removed 1110 or recessed 1110 to expose at least some of the vertical length of the nanowires 100, for bonding, if such ends are not already exposed. The nanoporous layer 1102 may be recessed or removed by chemical means, electrochemical means, or physical means, depending on the material 1102 used.

Figure 12:
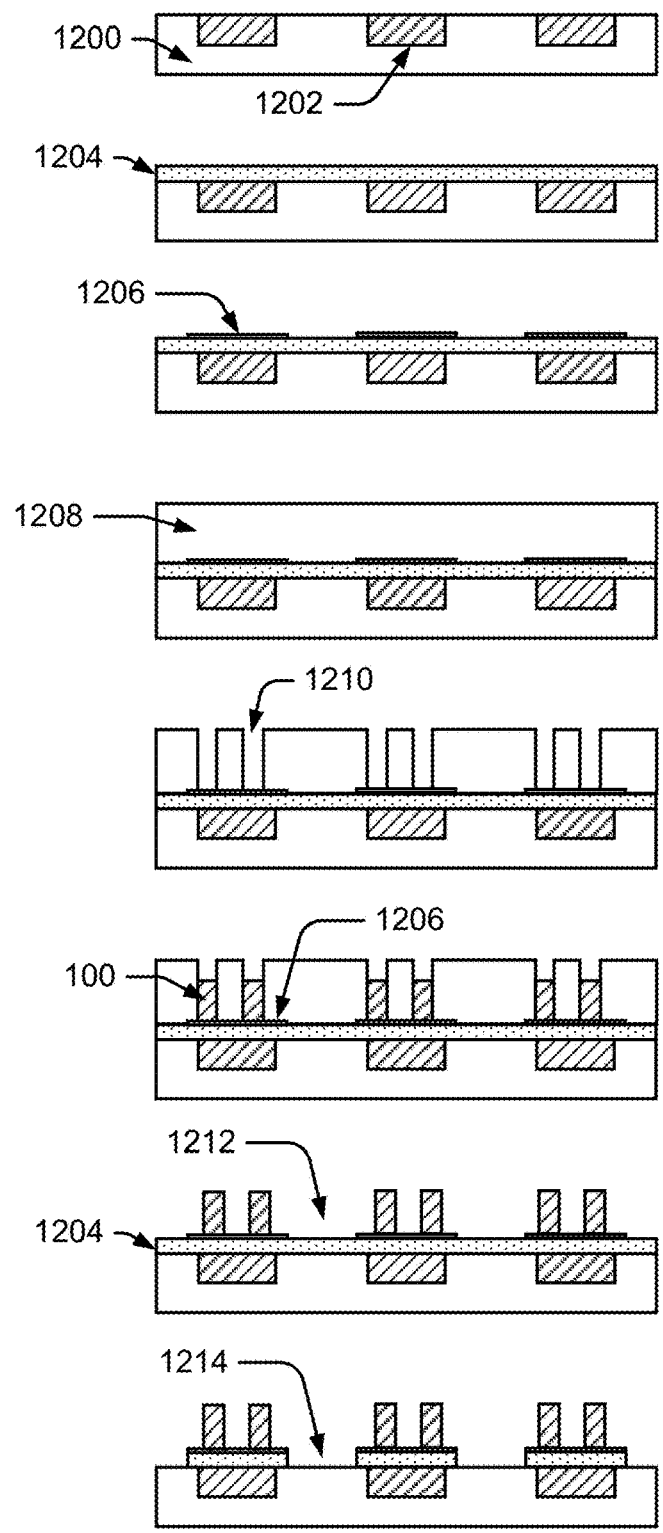
FIG. 12 is a diagram of an example process of creating nanowires through a combination lithography process.

FIG. 12 shows an example process of creating nanowires 100 through a combination lithography process. A chip, die, or wafer 1200 has conductive traces 1202, onto which a film of polymer 1204 or other material is spread for becoming a nanoporous layer for creating the nanowires 100. The polymer 1204 may be baked, if needed.

A seed layer 1206 of a first metal is deposited over conductors or pads where the nanowires 100 are to be present for bonding to an opposing conductive pad on another surface.

A photoresist layer 1208 is deposited over the seed layer 1206 and over the polymer layer 1204. Photolithography of the photoresist layer 1208 makes nanopores 1210 in the photoresist layer 1208. Alternatively, the photoresist layer 1208 is just a resist that is etched in another manner to make the nanopores 1210, without light. The nanopores may be 200 nm in diameter, or smaller.

Copper metal, or another metal, is plated or otherwise grown on the seed layer 1206, forming the nanowires 100. In an implementation, the metal plated or deposited as the nanowires 100 is a different metal than the first metal of the seed layer 1206. This is to provide selectivity for stripping or cleaning the copper metal or other metal used for the nanowires 100, so that the stripping or cleaning does not remove the attachment of the nanowires 100 from their seed layer 1206, which should be impervious to the stripper or cleaner.

The photoresist layer 1208 is stripped away 1212 leaving exposed nanowires 100, ready for compression against an opposing conductive pad and for direct metal bonding with the opposing conductive pad. The polymer layer 1204 may be partly removed 1214, depending on implementation.

Figure 13:
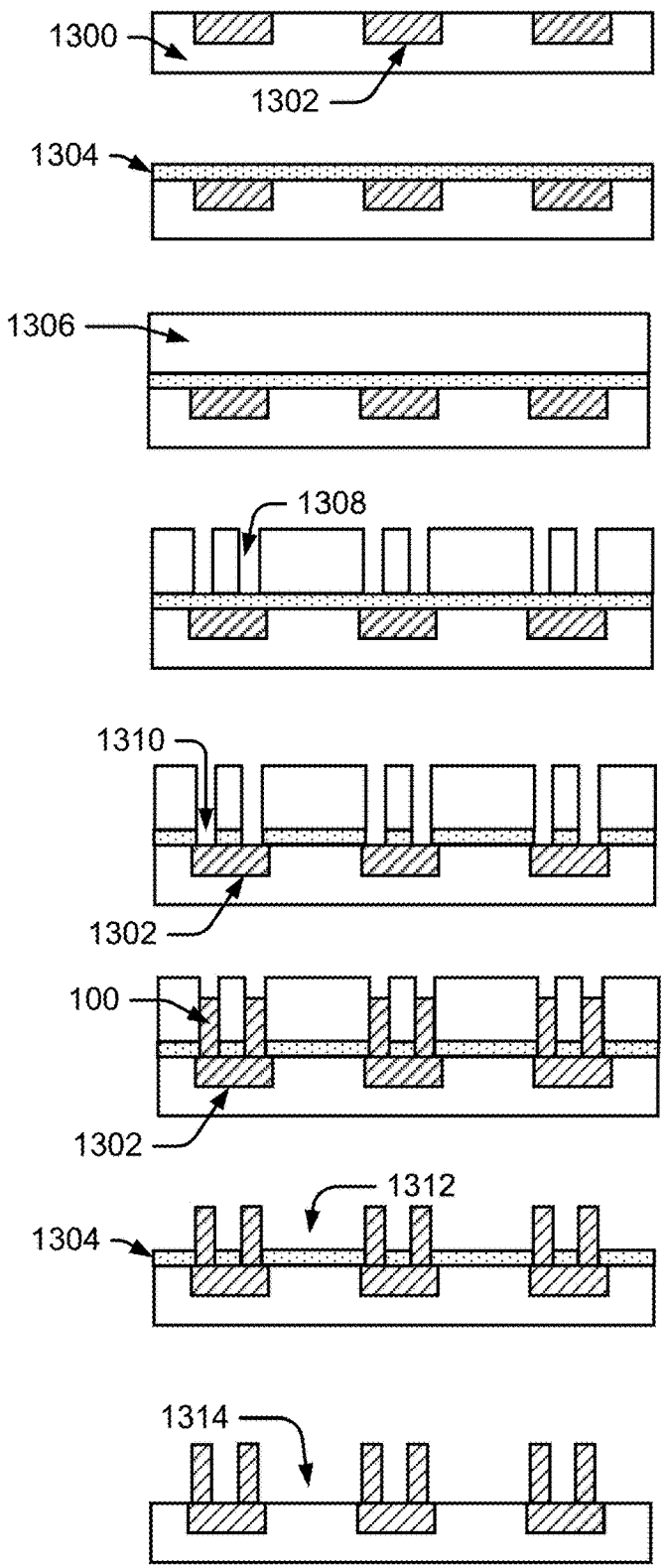
FIG. 13 is a diagram of another example process of creating nanowires through a combination lithography process.

FIG. 13 shows another example process of creating nanowires 100 through a combination lithography process.

In this process, the nanoporous layer is completely removed, with nanowires 100 grown directly on pads or traces to be bonded.

A chip, die, or wafer 1300 has conductive traces 1302, onto which a film of polymer 1304 or other material is spread for becoming a nanoporous layer for creating the nanowires 100. The polymer layer 1304 may be baked, if needed.

A photoresist layer 1306 is deposited over the polymer layer 1304. Photolithography of the photoresist layer 1306 makes nanopores 1308 in the photoresist layer 1306. Alternatively, the photoresist layer 1306 is just a resist that is etched in another manner to make the nanopores 1308, without light. The nanopores may be 200 nm in diameter, or smaller.

The nanopores 1308 in the photoresist layer 1306 are used to etch through the polymer layer 1304, to make extended nanopores 1310 down to the conductive pad 1302 of the chip, die, or wafer 1300.

Copper metal, or another metal, is plated or otherwise grown on the conductive pads 1302, forming the nanowires 100.

The photoresist layer 1306 is stripped away 1312 leaving exposed nanowires 100, ready for compression against an opposing conductive pad and for direct metal bonding with the opposing conductive pad. The nanoporous polymer layer 1304 is then removed 1314, leaving only conductive pads 1302 and the nanowires 100.

Figure 14:
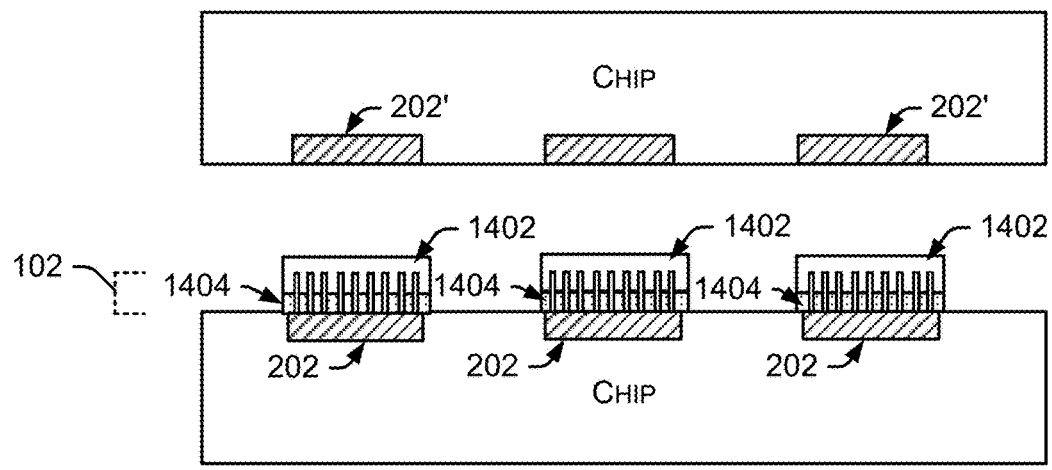
FIG. 14 is a diagram of a flowable joining material or solder applied to the nanowires of a nanowire bonding interface.
Figure 14:
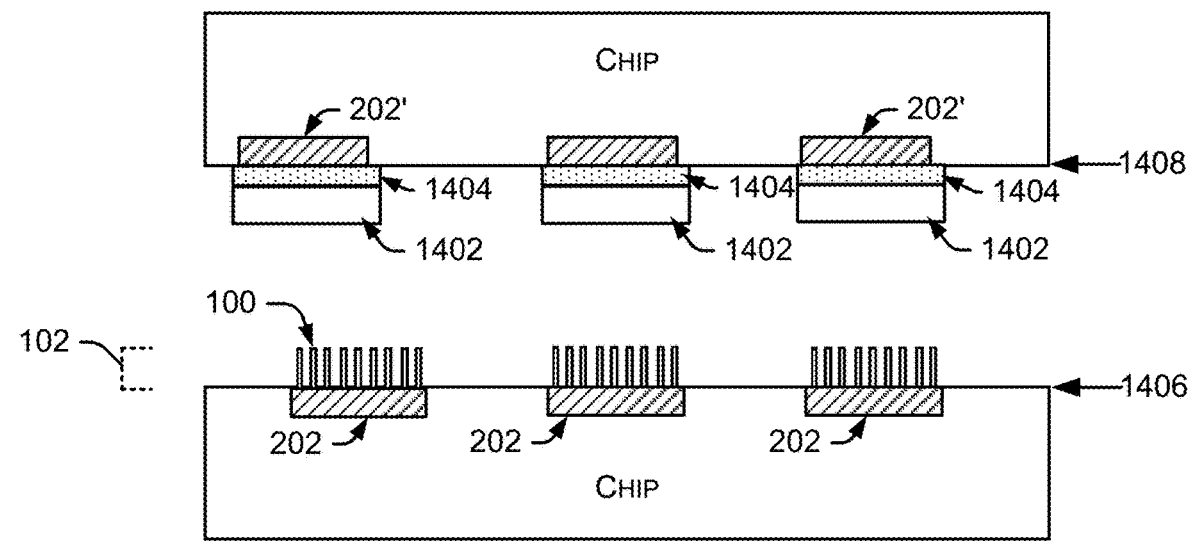

FIG. 14 shows an example nanowire bonding interface 102 in which the nanowires 100 are surmounted or mixed with a flowable joining material, such as tin metal (Sn) 1402 or a combination solder alloy. The "tinned" nanowires 100 may bond by elevating a temperature to the melting point of the tin or solder, or by compressive pressure when the solder or alloy is malleable, or by both raised temperature and applied pressure.

In an implementation, the nanowires 100 may be coated with the flowable joining material, such as a solder, and then heat and/or pressure may be applied to cause the solder or other flowable joining material on the nanowires 100 or opposing conductive pad to flow, making a solder bond.

In an implementation, the nanowire bonding interface 102 also includes a layer or film of a second metal besides tin, such as a nickel (Ni) layer 1404. A given microelectronics package 104 may use one of many different intermetallic compounds formed during solidifying of solders and during their reactions with the surfaces being soldered. The intermetallics may form distinct phases as inclusions in a ductile solid solution matrix or can form the matrix itself with metal inclusions, or can form various crystalline structures with different intermetallics. When the nanowires 100 are made of copper metal, a range of intermetallics may form between the copper metal and the tin or solder, with increasing proportion of the copper metal, such as $Cu-Cu_3Sn-Cu_6Sn_5-Sn$, and so forth. Gold or palladium may be used as a coating to facilitate bonding because they readily dissolve in solders. Copper and nickel 1404 tend to form intermetallic layers during soldering processes, forming $Ni_3Sn_4$, for example, in the solder-nickel intermetallic interface.

In a variation, the example nanowires 100 are formed on the conductive pads 108 of one surface 1406 to be bonded, while the tin 1402 or solder alloy, and/or nickel 1404 are coated or formed on opposing conductive pads 108' that have no nanowires 100, on the opposing surface 1408.

Figure 15:
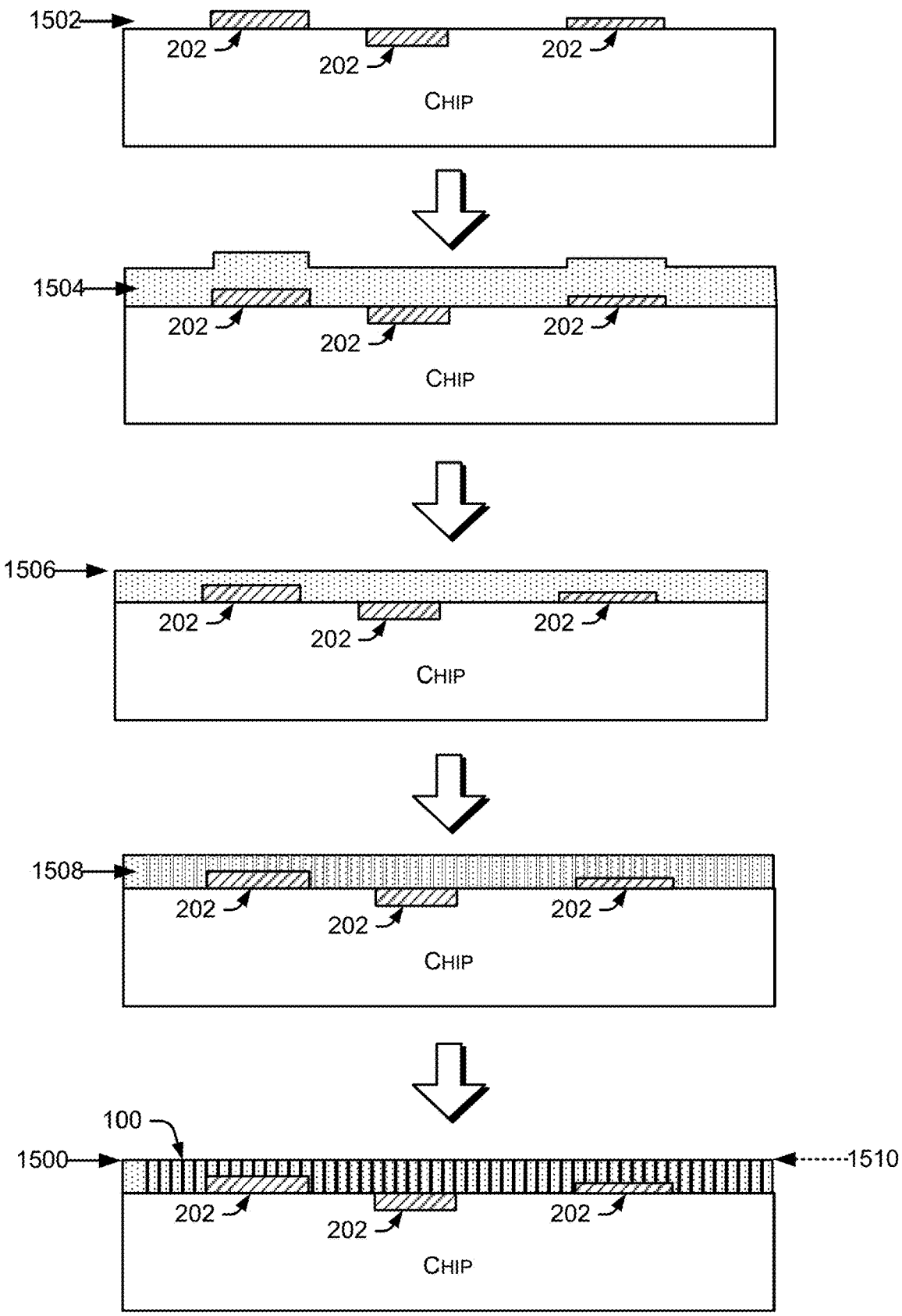
FIG. 15 is a diagram of an example planarized nanowire bonding interface.

FIG. 15 shows an implementation of the nanowire bonding interface 1500, used in this scenario to make a flat top surface 1500 on a die, wafer, or device that has an uneven top surface 1502. The flat nanowire bonding interface 1500 may used for direct bonding, or other bonding, or may be used to create a spacer or interposer between dies, for example. The uneven surface 1502 of the die, wafer, or device is covered with a material 1504, which is then optionally flattened 1506. Pores are created in the material 1504, to make a nanoporous layer 1508. Nanowires 100 are then grown in the pores. Instead of the nanoporous layer 1508 being at least partially removed or recessed as in previously described implementations, the top surface 1500 of the nanoporous layer 1508 is flattened 1510, lapped, or polished by CMP or other planarizing techniques for direct bonding, or other bonding. The flat surface 1500 has planar cross-sectional ends of the nanowires 100 that have been grown in the pores of the nanoporous material 1508 and subsequently planarized 1510, and has remaining areas that consist of the flattened nanoporous material 1504. At this point, the flat surface 1500 can be direct-bonded through DBI® or other direct bonding techniques to conductive pads of an opposing surface 1514.

Figure 16:
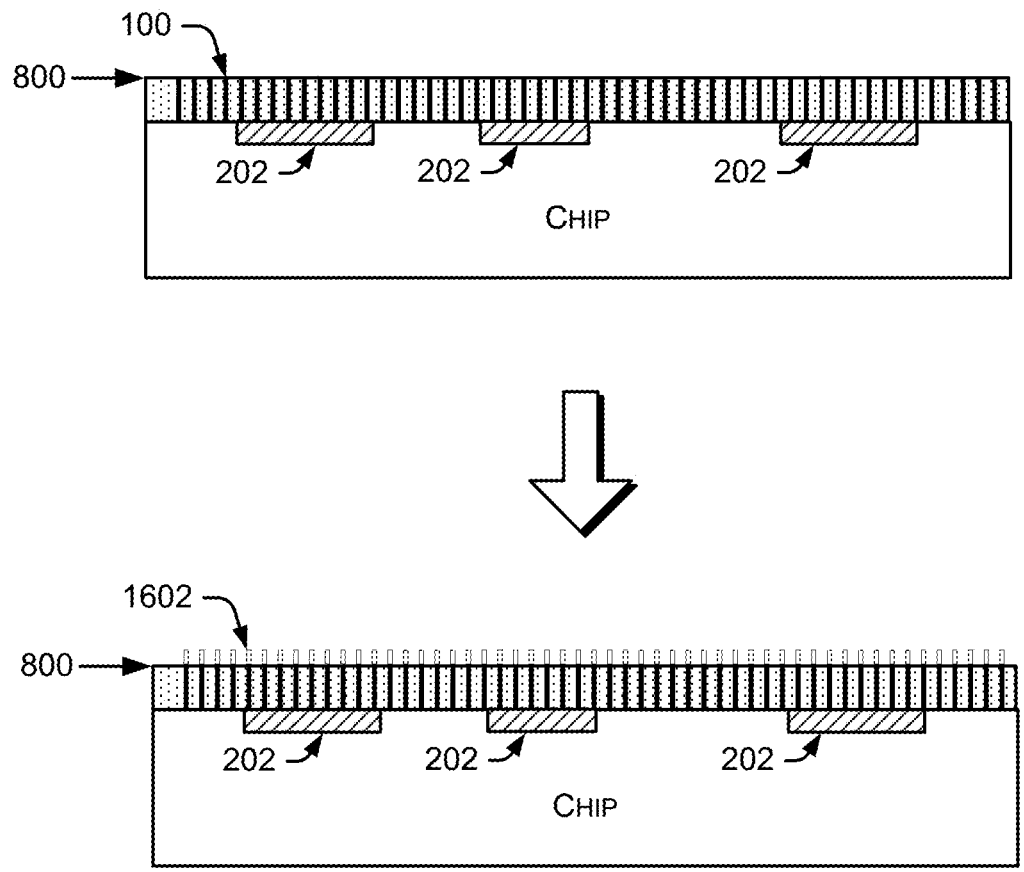
FIG. 16 is a diagram of additional nanowire growth on a planarized nanowire bonding interface.

FIG. 16 shows another implementation of the nanowire bonding interface 102 in which the flat surface 1500 of FIG. 15 is used as a base to further grow the nanowires 100 to a greater vertical height 1602 by electroless plating of the same or a different metal, such as copper, nickel, gold, etc., or by metallic crystal growth, vapor deposition crystal growth, and so forth, on top of the existing nanowires 100.

Figure 17:
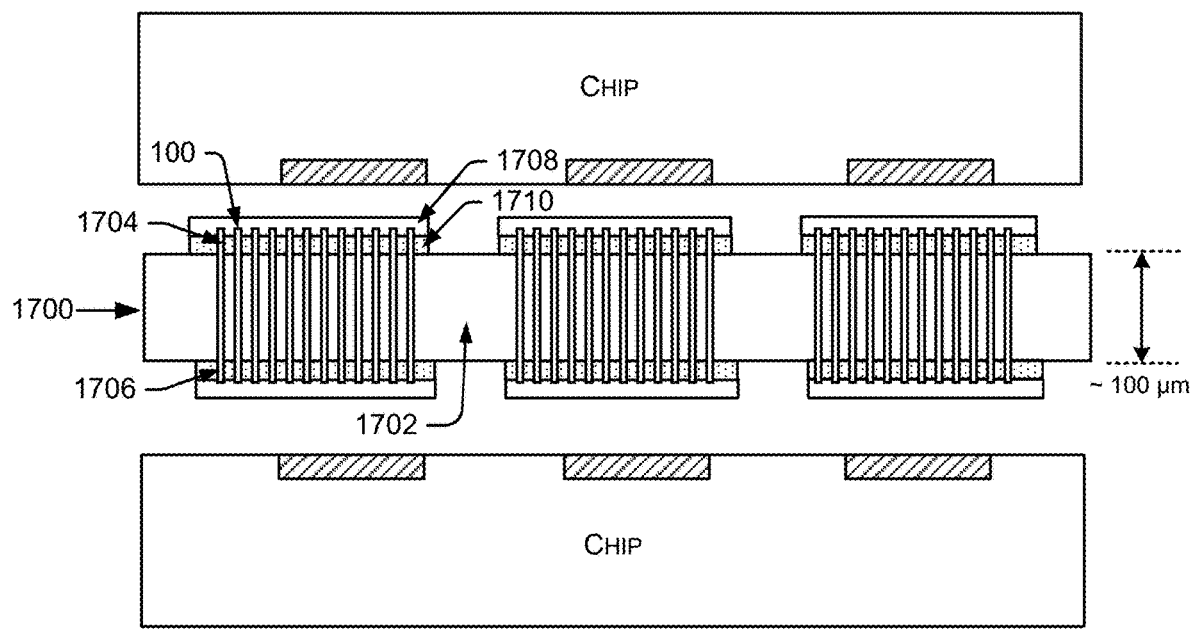
FIG. 17 is a diagram of an example two-sided interposer with nanowire bonding interfaces on each side.

FIG. 17 shows an example interposer 1700, with nanowires 100 disposed through the substrate 1702, in one implementation. The substrate 1702 may be porous silicon or oxidized alumina, ceramic, or other materials. The example interposer 1700 has a first side and a second side, wherein the nanowires 100 penetrate through the interposer 1700 to make respective layers of nanowire ends 1704 & 1706 on opposing sides of the interposer 1700. One or both sides of the nanowire ends 1704 & 1706 may be tinned or primed with solder or tin metal 1708 and/or another metal 1710, such as nickel, or alloy. The example two-sided interposer 1700 can bond a chip or wafer, or both chips and wafers, on both of its sides 1704 & 1706. The interposer 1700, including the respective layers of nanowire ends 1704 & 1706, may have a total thickness of approximately 100 μm or less.

Example Method

Figure 18:
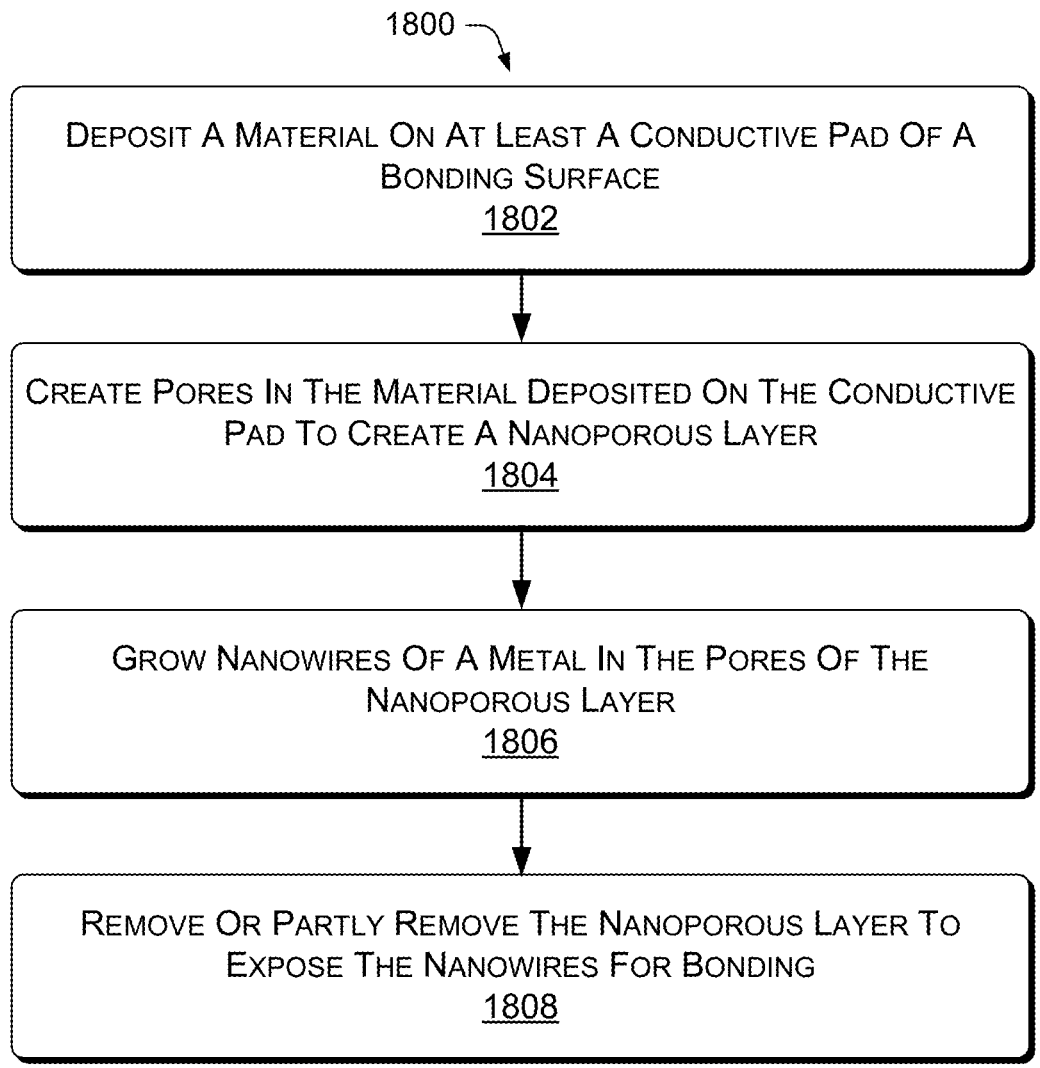
FIG. 18 is a flow diagram of an example method of fabricating an example nanowire bonding interface.

FIG. 18 shows an example method 1800 of creating a nanowire bonding interface. In the flow diagram of FIG. 18, operations of the example method 1800 are shown in individual blocks.

At block 1802, a material is deposited on at least a conductive pad of a bonding surface.

At block 1804, pores are created in the material deposited on the conductive pad to create a nanoporous layer.

At block 1806, nanowires of a metal are grown in the pores of the nanoporous layer.

At block 1808, at least a partial thickness of the nanoporous layer is removed or recessed to expose the nanowires for bonding with an opposing conductive pad.

In the foregoing description and in the accompanying drawings, specific terminology and drawing symbols have been set forth to provide a thorough understanding of the disclosed embodiments. In some instances, the terminology and symbols may imply specific details that are not required to practice those embodiments. For example, any of the specific dimensions, quantities, material types, fabrication steps and the like can be different from those described above in alternative embodiments. The term "coupled" is used herein to express a direct connection as well as a connection through one or more intervening circuits or structures. The terms "example," "embodiment," and "implementation" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

While the present disclosure has been disclosed with respect to a limited number of embodiments, those skilled in the art, having the benefit of this disclosure, will appreciate numerous modifications and variations there from. It is intended that the appended claims cover such modifications and variations as fall within the true spirit and scope of the disclosure.

What is claimed is:

1. A method, comprising:
    creating a nanoporous layer on a conductive pad of a microelectronic device or wafer;
    creating nanowires within pores of the nanoporous layer;
    removing or recessing at least part of the nanoporous layer to reveal at least a part of the nanowires for at least conductive contact with an opposing conductive surface of an opposing microelectronic device or wafer; and
    direct hybrid bonding a bonding surface of the microelectronic device or wafer to the opposing microelectronic device or wafer, wherein the direct hybrid bonding comprises direct metal bonding the nanowires to the opposing conductive surface and direct bonding the nanoporous layer to the opposing microelectronic device or wafer.

2. The method of claim 1, further comprising creating nanowires with a diameter less than 200 nanometers, wherein each nanowire has a height between approximately 200 nanometers and approximately 1000 nanometers (1 µm).

3. The method of claim 1, wherein a height-to-diameter aspect ratio of each nanowire enables the nanowire to partially collapse against the opposing conductive surface providing a compression or a contact pressure of the nanowire for conductively contacting or bonding to the opposing conductive surface.

4. The method of claim 1, wherein creating the nanoporous layer further comprises depositing a thin layer of a material on the conductive pad; and
    forming pores in the thin layer of the material via an etching process or a lithography process to make the nanoporous layer.

5. The method of claim 1, further comprising flowing a joining material or a solder between the nanowires to conductively secure the nanowires to the opposing conductive surface.

6. The method of claim 5, further comprising applying pressure to penetrate the nanowires through the solder.

7. The method of claim 1, further comprising permanently joining the microelectronic device or wafer comprising the nanowires with a second microelectronic device or wafer comprising the opposing conductive surface with an adhesive.

8. The method of claim 1, further comprising embedding metal pads laterally adjacent to between the conductive pad, the metal pads configured to vertically bond between surfaces being joined.

9. The method of claim 8, wherein the metal pads comprise a heatsink.

10. The method of claim 1 further comprising exposing a conductive surface of a through substrate via for forming nanowires thereupon.

11. The method of claim 1, wherein each conductive pad comprises a length or a diameter less than approximately 5 µm.

12. The method of claim 1, wherein multiple nanowires are conductively connected to each conductive pad.

13. The method of claim 1, further comprising creating the nanoporous layer on at least the conductive pad and a portion of the bonding surface.

14. The method of claim 13, further comprising creating nanowires within pores of the nanoporous layer at least at the conductive pad and the portion of the bonding surface.

15. A method, comprising:
    forming a dielectric layer on at least a conductive pad and a portion of a bonding surface of a microelectronic device or wafer;
    forming nanowires within pores of the dielectric layer over the conductive pad;
    removing or recessing at least part of the dielectric layer to reveal at least a part of the nanowires for at least conductive contact with an opposing conductive surface of an opposing microelectronic device or wafer; and
    direct hybrid bonding a bonding surface of the microelectronic device or wafer to the opposing microelectronic device or wafer, wherein the direct hybrid bonding comprises direct metal bonding the nanowires to the opposing conductive surface and directly bonding the dielectric layer on the portion of the bonding surface to the opposing microelectronic device or wafer.

16. The method of claim 15, further comprising forming nanowires within pores of the dielectric layer at least at the conductive pad and the portion of the bonding surface.

17. The method of claim 15, wherein the dielectric layer comprises a nanoporous layer.

18. The method of claim 15, wherein forming the dielectric layer further comprises depositing a thin layer of a material on the conductive pad; and
    forming pores in the thin layer of the material via an etching process or a lithography process to make the dielectric layer.

19. The method of claim 15, further comprising flowing a joining material or a solder between the nanowires to conductively secure the nanowires to the opposing conductive surface.

20. The method of claim 15, wherein multiple nanowires are conductively connected to each conductive pad.

* * * * *